(12) United States Patent
Guan et al.

(10) Patent No.: US 8,541,248 B2
(45) Date of Patent: Sep. 24, 2013

(54) METHODS FOR FABRICATING PLANAR HEATER STRUCTURES FOR EJECTION DEVICES

(75) Inventors: Yimin Guan, Lexington, KY (US);
Burton Joyner, II, Lexington, KY (US);
Zach Reitmeier, Oak Ridge, NC (US)

(73) Assignee: Lexmark International, Inc., Lexington, KY (US)

( * ) Notice: Subject to any disclaimer, the term of this patent is extended or adjusted under 35 U.S.C. 154(b) by 0 days.

(21) Appl. No.: 13/248,298

(22) Filed: Sep. 29, 2011

(65) Prior Publication Data
US 2013/0084662 A1    Apr. 4, 2013

(51) Int. Cl.
*H01L 21/02* (2006.01)

(52) U.S. Cl.
USPC ......... 438/21; 438/27; 438/347; 347/56

(58) Field of Classification Search
USPC ........................ 438/21, 27, 347
See application file for complete search history.

(56) References Cited

U.S. PATENT DOCUMENTS

| | | | |
|---|---|---|---|
| 6,483,045 B1 * | 11/2002 | Wang et al. | 174/264 |
| 7,422,926 B2 * | 9/2008 | Pellizzer et al. | 438/95 |
| 2010/0110145 A1 * | 5/2010 | Guan et al. | 347/56 |

OTHER PUBLICATIONS

Hyun Wook Ro et al., "Structure-Property Relationships for Methylsilsesquioxanes", Jan. 7, 2010, American Chemical Society, vol. 22, pp. 1330-1339.*

* cited by examiner

*Primary Examiner* — Zandra Smith
*Assistant Examiner* — Damian A Hillman

(57) ABSTRACT

Methods and apparatus teach a substrate wafer having a plurality of plugs configured there within. The method also includes depositing and patterning a layer of a second metallic material over the substrate wafer, providing a layer of a dielectric material of a predetermined thickness over the patterned layer of the second metallic material, and conducting chemical mechanical polishing of the layer of the dielectric material to form a planarized top surface while exposing the patterned layer of the second metallic material. The method further includes cleaning the planarized top surface, depositing and patterning a resistor film over the planarized top surface, depositing one or more blanket films over the patterned resistor film, and patterning and etching the one or more blanket films. Further disclosed are planar heater structures and additional methods for fabricating the planar heater structures.

6 Claims, 18 Drawing Sheets

METHODS FOR FABRICATING PLANAR HEATER STRUCTURES FOR EJECTION DEVICES

CROSS REFERENCES TO RELATED APPLICATIONS

None.

STATEMENT REGARDING FEDERALLY SPONSORED RESEARCH OR DEVELOPMENT

None.

REFERENCE TO SEQUENTIAL LISTING, ETC.

None.

BACKGROUND

1. Field of the Disclosure

The present disclosure relates generally to ejection devices for printers, and more particularly, to methods for fabricating planar heater structures of the ejection devices.

2. Description of the Related Art

Fabrication of a typical ejection device (printhead) for a printer, such as an inkjet printer, involves fabrication of a heater structure (heater stack) using a substrate wafer, such as a silicon-based substrate wafer. Specifically, the substrate wafer may be used for arranging one or more fluid ejection elements (resistor elements/heat resistors) thereupon and for configuring a flow feature layer and a nozzle plate over the substrate wafer. Further, a drive circuitry layer made by complementary metal-oxide-semiconductor (CMOS) implantation may be used over the substrate wafer in order to electrically connect the ejection device to the printer during use.

Various backend and frontend processes have been employed for fabricating heater structures of ejection devices. Specifically, CMOS backend process is one such technique used for fabricating heater structures. Further, various layers (such as metallic layers and the like) may be used with a substrate wafer in a CMOS backend process and the surface of the substrate wafer may then be planarized using a chemical mechanical polishing (CMP) technique. However, the existing CMOS backend processes are incapable of completely/efficiently using the advantage of frontend CMP technique.

Further, with evolving technologies in the domain of ejection devices, heater structures with planar surfaces are being desired to be employed in order to increase efficiency of the ejection devices. Accordingly, for best utilization of such evolving technologies, CMP technique in backend processes may be a desired option to avail. Specifically, the CMP technique allows for planarization of a wafer surface. Accordingly, with CMP backend processes, surface topology of heater chips of any ejection device may be significantly improved. Such surface topology improvement may assist in overcoming current topography related issues associated with photo-imageable nozzle plate and fluid bottle assembly. In addition, fewer process steps may be required to achieve the desired surface topology as compared with existing processes. Moreover, CMP backend processes may assist in improving glass nozzle plate process margin and/or other nozzle technologies, and to enable other Micro-Electro-Mechanical Systems (MEMS) backend processes.

In general, CMP technique is traditionally performed on a material, such as silicon oxide and tungsten, for yielding planar heater structures from substrate wafers. However, other materials may be polished given the right choice of slurry employed for the CMP technique, and/or chemical and mechanical agents, to aid in polishing. For example, the choice of Methylsilsesquioxane (MSQ) in heater structures is made for insulative properties to aid in a more efficient thermal transfer for a fluid (ink) within ejection devices. Though, polishing of MSQ by the CMP technique is a slow process, and sometimes prone to defects, however, there exist appropriate slurries and compatible CMP methods that may effectively be used. Another material similar to MSQ is spin-on-glass (SOG) material. A CMP technique may also be carried out while using aluminum due to the simplicity of patterning of aluminum into any desired design. However, patterning aluminum by the CMP technique is problematic, as aluminum is a soft metal and is prone to smearing, dishing and other such defects.

Accordingly, there still persists a need for efficient and effective methods for fabricating planar heater structures by employing CMP backend processes, while overcoming the aforementioned disadvantages.

SUMMARY OF THE DISCLOSURE

In view of the foregoing disadvantages inherent in the prior art, the general purpose of the present disclosure is to provide methods for fabricating planar heater structures for ejection devices, by including all the advantages of the prior art, and overcoming the drawbacks inherent therein.

In one aspect, the present disclosure provides a method for fabricating a planar heater structure for an ejection device. The method includes providing a substrate wafer. The substrate wafer includes a plurality of plugs configured therewithin. Each plug of the plurality of plugs is formed as an electrical connection and is composed of a first metallic material. The method also includes depositing and patterning a layer of a second metallic material over the substrate wafer. Further, the method includes providing a layer of a dielectric material of a predetermined thickness over the patterned layer of the second metallic material. Furthermore, the method includes conducting chemical mechanical polishing of the layer of the dielectric material to form a planarized top surface while exposing the patterned layer of the second metallic material. Moreover, the method includes cleaning the planarized top surface. Additionally, the method includes depositing and patterning a resistor film over the planarized top surface. The method also includes depositing one or more blanket films over the patterned resistor film. In addition, the method includes patterning and etching the one or more blanket films.

In another aspect, the present disclosure provides a method for fabricating a planar heater structure for an ejection device. The method includes providing a substrate wafer. The substrate wafer includes a plurality of electrical connections configured therewithin. Each electrical connection of the plurality of electrical connections is composed of a first metallic material. Further, the method includes depositing a layer of a dielectric material over the substrate wafer. Furthermore, the method includes patterning the layer of the dielectric material to form at least one via therewithin. Each via of the at least one via is coupled with one or more corresponding electrical connections of the plurality of electrical connections configured within the substrate wafer. The method also includes providing a layer of a second metallic material over the patterned layer of the dielectric material such that the second metallic material fills the each via of the at least via in the form of a plug. In addition, the method includes conducting chemical mechanical polishing of the layer of the second metallic material to form a planarized top surface. Further, the method includes cleaning the planarized top surface. Moreover, the method includes depositing and patterning a resistor film over the planarized top surface. Additionally, the method includes depositing one or more blanket films over the patterned resistor film. The method also includes patterning and etching the one or more blanket films.

In yet another aspect, the present disclosure provides a method for fabricating a planar heater structure for an ejection device. The method includes providing a substrate wafer. The substrate wafer includes a plurality of electrical connections configured therewithin. Each electrical connection of the plurality of electrical connections is composed of a metallic material. The method also includes applying a layer of a photo-resist material over the substrate wafer. Further, the method includes patterning the layer of the photo-resist material to form a plurality of openings therewithin. Furthermore, the method includes etching the substrate wafer through each opening of the plurality of openings to form a plurality of trenches within a top portion of the substrate wafer. In addition, the method includes removing the layer of the photo-resist material from over the substrate wafer. Moreover, the method includes providing a layer of a dielectric material over the substrate wafer such that each trench of the plurality of trenches is filled with the dielectric material. The method also includes conducting chemical mechanical polishing of the layer of the dielectric material to expose the each electrical connection of the plurality of electrical connections of the substrate wafer and to form a planarized top surface. Further, the method includes cleaning the planarized top surface. Additionally, the method includes depositing and patterning a resistor film over the planarized top surface. Further, the method includes depositing one or more blanket films over the patterned resistor film. Furthermore, the method includes patterning and etching the one or more blanket films.

In still another aspect, the present disclosure provides a planar heater structure for an ejection device. The planar heater structure includes a substrate wafer having a plurality of electrical connections configured therewithin. Each electrical connection of the plurality of electrical connections is composed of a first metallic material. Further, the planar heater structure includes a layer of a dielectric material disposed one of over the substrate wafer and within a top portion of the substrate wafer. The planar heater structure also includes a planarized top surface configured over the substrate wafer and the layer of the dielectric material by chemical mechanical polishing. Furthermore, the planar heater structure includes a resistor film disposed over the planarized top surface. In addition, the planar heater structure includes one or more blanket films disposed over the resistor film.

In still another aspect, the present disclosure provides a method for fabricating a planar heater structure on a substrate wafer for an ejection device. The method includes forming a plurality of conductive plugs vertically in the substrate wafer. Each plug of the plurality of plugs includes an exposed top isolated from one another in the substrate wafer and composed of a first metallic material. Further, the method includes forming a second metallic material over the exposed top of said each of the plurality of plugs to make an electrical connection between the first and second metallic materials. Furthermore, the method includes forming a layer of a dielectric material of a predetermined thickness over the second metallic material and regions of the substrate wafer intervening between the conductive plugs. Moreover, the method includes chemically mechanically polishing the layer of the dielectric material to form a planarized top surface that exposes the second metallic material. Additionally, the method includes forming a resistor film over the planarized top surface that spans from a first to a second instance of the second metallic material and overlies an intervening portion of the dielectric material.

BRIEF DESCRIPTION OF THE DRAWINGS

The above-mentioned and other features and advantages of the present disclosure, and the manner of attaining them, will become more apparent and will be better understood by reference to the following description of embodiments of the disclosure taken in conjunction with the accompanying drawings, wherein.

DETAILED DESCRIPTION

It is to be understood that various omissions and substitutions of equivalents are contemplated as circumstances may suggest or render expedient, but these are intended to cover the application or implementation without departing from the spirit or scope of the claims of the present disclosure. It is to be understood that the present disclosure is not limited in its application to the details of components set forth in the following description. The present disclosure is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Further, the terms "a" and "an" herein do not denote a limitation of quantity, but rather denote the presence of at least one of the referenced item.

In one aspect, the present disclosure provides a method for fabricating a planar heater structure for an ejection device (printhead) of a printer, such as an inkjet printer. The method of the present disclosure is explained in conjunction with FIG. 1. Further, FIGS. 2-8 depict a process flow for fabrication of the planar heater structure using the method of FIG. 1. Specifically, FIGS. 2-8 depict partial cross sectional views for the planar heater structure being fabricated using the method of FIG. 1.

Figure 1:
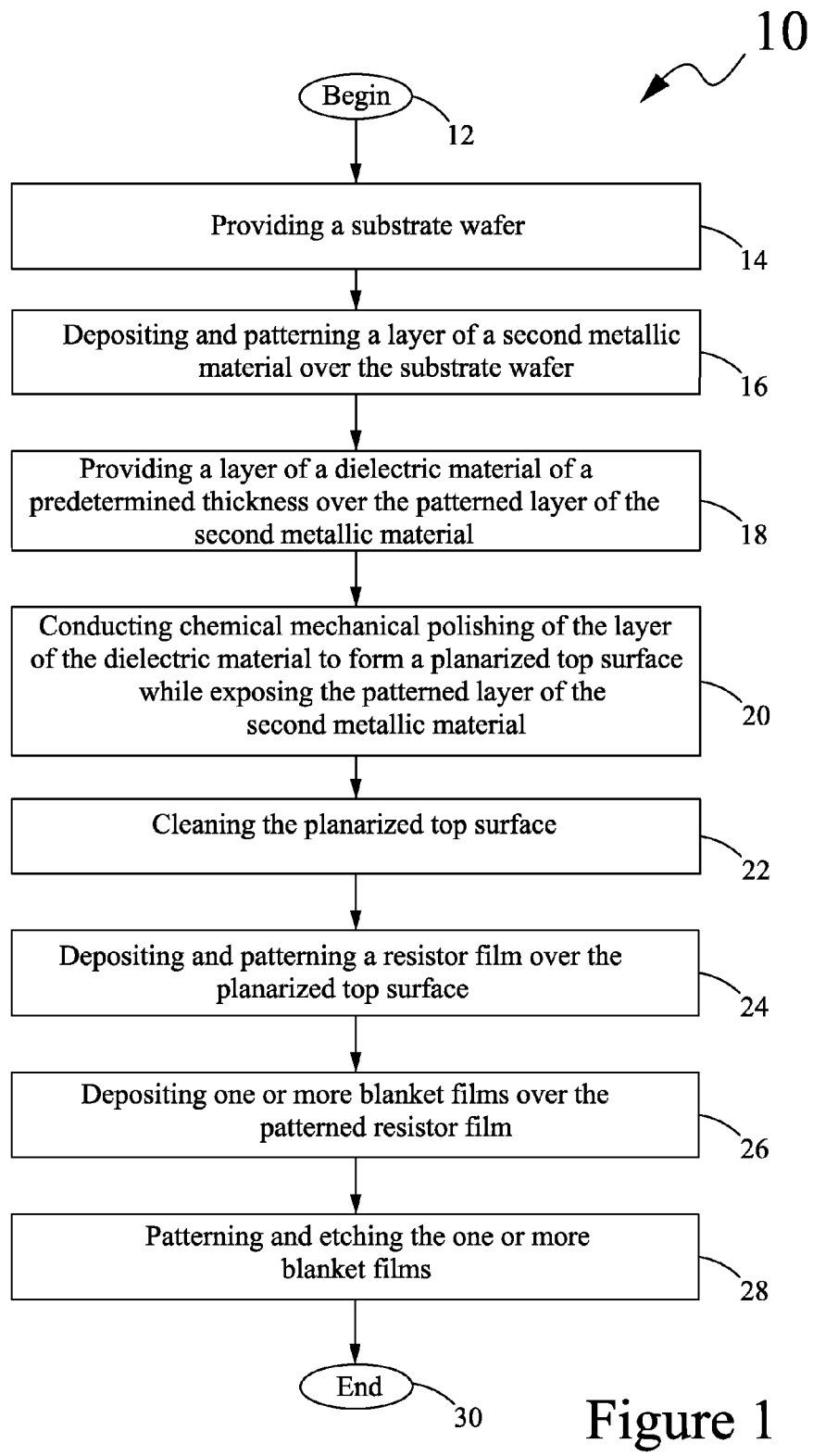
FIG. 1 depicts a method for fabricating a planar heater structure for an ejection device, in accordance with an embodiment of the present disclosure.
Figure 8:
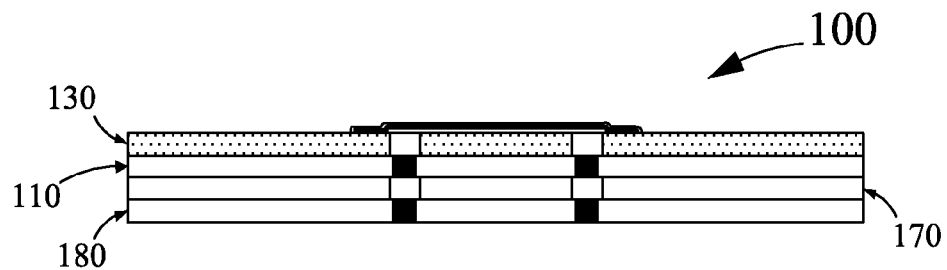

FIG. 1 depicts a method 10 for fabricating a planar heater structure 100 (as depicted in FIG. 8), for an ejection device (not shown). The method 10 begins at 12.

Figure 2:
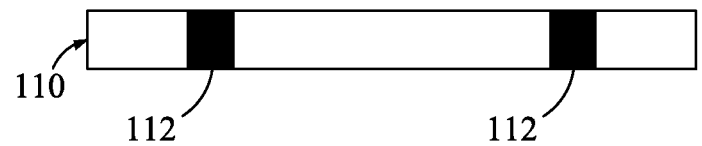
FIGS. 2-8 depict a process flow for fabrication of the planar heater structure using the method of FIG. 1.

At 14, a substrate wafer 110 (such as a silicon/silicon dioxide ($SiO_2$) based substrate wafer), as depicted in FIG. 2, is provided. The substrate wafer 110 includes a plurality of plugs 112 configured therewithin. Each plug of the plugs 112 is formed as an electrical connection and is composed of a first metallic material. In the present embodiment, the first metallic material is tungsten. It will be evident that the each plug of the plugs 112 may be composed of any other metallic material and may be configured to have any shape and size as per a manufacturer's preference. Further, the plugs 112 are attached to circuitry formed in subsequent metallic layers to be disposed beneath the substrate wafer 110.

Further, the substrate wafer 110 with the plugs 112 may also be provided with a thin protective layer (not shown) at least partially coating the substrate wafer 110. Such a thin protective layer may be composed of any material, such as an oxide, as known in the art for substrate wafers, such as the substrate wafer 110. Additionally, in the presence of the thin protective layer, a surface (not numbered) of the substrate wafer 110 may be treated by techniques as known in the art for exposing the plugs 112.

Figure 3:
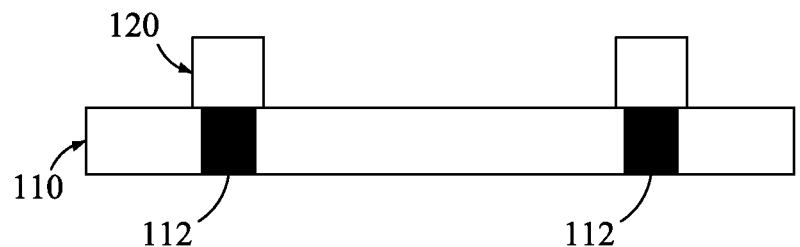

At 16, a layer 120 of a second metallic material is deposited and patterned over the substrate wafer 110, as depicted in FIG. 3. Specifically, the layer 120 of the second metallic material is deposited across the entire surface of the substrate wafer 110 and patterned into power bus lines and connections for heater resistors. The patterning of the layer 120 of the second metallic material may be achieved by using an appropriate mask, as known in the art and based on a manufacturer's preference.

In the present embodiment, the second metallic material is aluminum. The method 10 may also include depositing a thin protective layer (not shown) on a top surface (not numbered) of the layer 120 of the second metallic material prior to patterning the layer 120 of the second metallic material. Alternatively, the method 10 may include depositing the protective layer on the top surface of the layer 120 of the second metallic material after patterning the layer 120 of the second metallic material. Such protective layer may either be a metallic layer or a ceramic layer that may be deposited over the layer 120 of the second metallic material either before or after patterning to aid in further processing. Suitable examples of the materials used for the protective layer include, but are not limited to, tantalum (Ta), tantalum nitride (TaN), tantalum aluminum nitride (TaAlN), titanium (Ti), titanium nitride (TiN) and the like.

Figure 4:
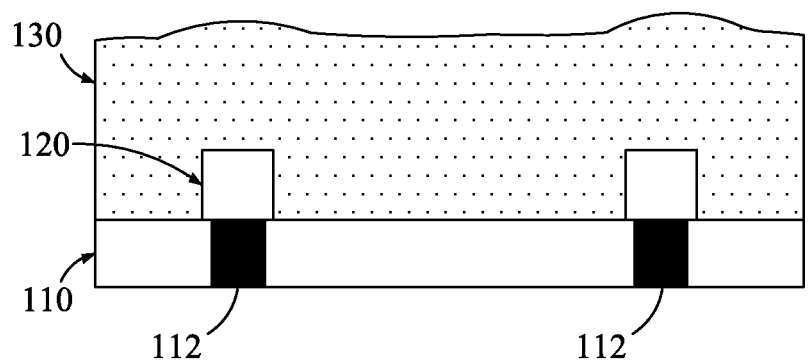

At 18, a layer 130 of a dielectric material of a predetermined thickness is provided over the patterned layer 120 of the second metallic material, as depicted in FIG. 4. Specifically, the layer 130 of the dielectric material may be either spun or deposited up to a predetermined thickness, such as 3×, of the thickness of the layer 120 of the second metallic material in order to allow a uniform/even coverage of the substrate wafer 110 in preparation for chemical mechanical polishing (CMP).

Suitable examples of the dielectric material include, but are not limited to, Spin-On-Glass (SOG), Methylsilsesquioxane (MSQ), Undoped Silicate Glass (USG), silicon oxide (for example, $SiO_2$), and such other inter-metal dielectric materials. In the present embodiment, the dielectric material used is MSQ.

Figure 5:
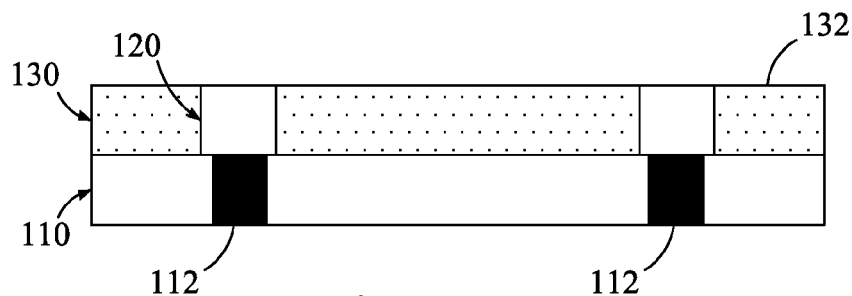

At 20, CMP of the layer 130 of the dielectric material is conducted to form a planarized top surface 132 while exposing the patterned layer 120 of the second metallic material, as depicted in FIG. 5. Specifically, the dielectric material from the layer 130 of the dielectric material is removed down to the underlying metallic layer by CMP by using appropriate CMP slurry (as known in the art) with a favorable etch selection for the second metallic material, such as aluminum.

More specifically, the layer 130 of the dielectric material leaves a certain amount of irregular topography over the patterned layer 120 of the second metallic material (as depicted in FIG. 4), and such topography is transformed to the planarized top surface 132 by CMP (as depicted in FIG. 5). Further, CMP planarizes the layer 130 of the dielectric material along with certain amount of the layer 120 of the second metallic material coplanar with the layer 130 of the dielectric material, in order to achieve a uniform planar surface (planarized top surface 132).

Also, in case the top surface of the layer 120 of the second metallic material is provided with the protective layer (as described above), the protective layer may then serve as an etch stop to protect the second metallic material from defects such as dishing and hillock formation during CMP.

Further, the polished layer 130 of the dielectric material may also be patterned based on a manufacturer's preference and requirements.

Figure 6:
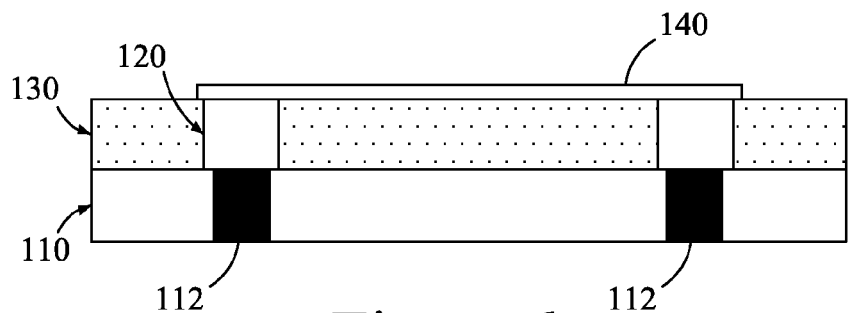

At 22, the planarized top surface 132 is cleaned. At 24, a resistor film 140 is deposited and patterned over the planarized top surface 132, as depicted in FIG. 6. The resistor film 140 may be composed of any material as known in the art. The patterning of the resistor film 140 may be achieved using an appropriate mask, as known in the art and based on a manufacturer's preference.

When the protective layer composed of materials such as Ta, TaN, Ti, TiN and the like, other than TaAlN is deposited over the layer 120 of the second metallic material, a light sputter etch may be performed to remove the protective layer in order to make electrical contact. However, when the protective layer composed of TaAlN is deposited over the layer 120 of the second metallic material, the protective layer may be retained over the layer 120 of the second metallic material when the resistor film 140 is being deposited and patterned.

Figure 7:
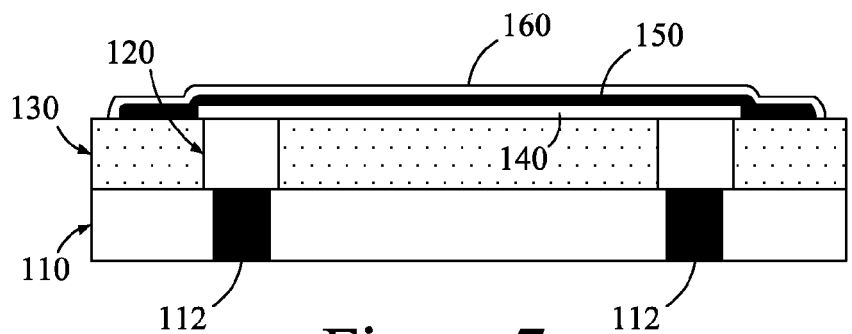

At 26, one or more blanket films, such as a blanket film 150 and a blanket film 160, are deposited over the patterned resistor film 140. At 28, the one or more blanket films are patterned and etched, as depicted in FIG. 7. Each blanket film of the one or more blanket films is one of silicon based blanket film, composed of materials such as silicon and silicon nitride (SiN); and tantalum based blanket film, composed of materials such as Ta. Further, the blanket film 150 and the blanket film 160 may be patterned and etched either simultaneously or independently. Accordingly, the patterning of the blanket film 150 and the blanket film 160 may be achieved by using one or more appropriate masks, as known in the art and based on a manufacturer's preference.

Further, a protective overcoat (PO) layer (not shown) composed of materials, such as silicon carbide and the like, may be deposited and patterned over the one or more blanket films based on a manufacturer's preference.

The method 10 ends at 30. Based on the foregoing, the method 10 represents a process flow involving planarization of a dielectric material, such as MSQ.

FIG. 8 depicts a wide view (partial cross-sectional view) of the planar heater structure 100 illustrating a planar heater surface, constituted by the planarized top surface 132, around a heater area (not numbered) constituted by the resistor film 140; and various layers, including the layer 130 of the dielectric material, and additional layers 170 and 180 underneath the planar heater surface. Further, it will be evident that the additional layers 170 and 180 may be layers, such as silicon-based layers, with corresponding power bus lines and electrical connections (not numbered), based on a manufacturer's preference, to form a heater stack of a requisite thickness.

Figure 9:
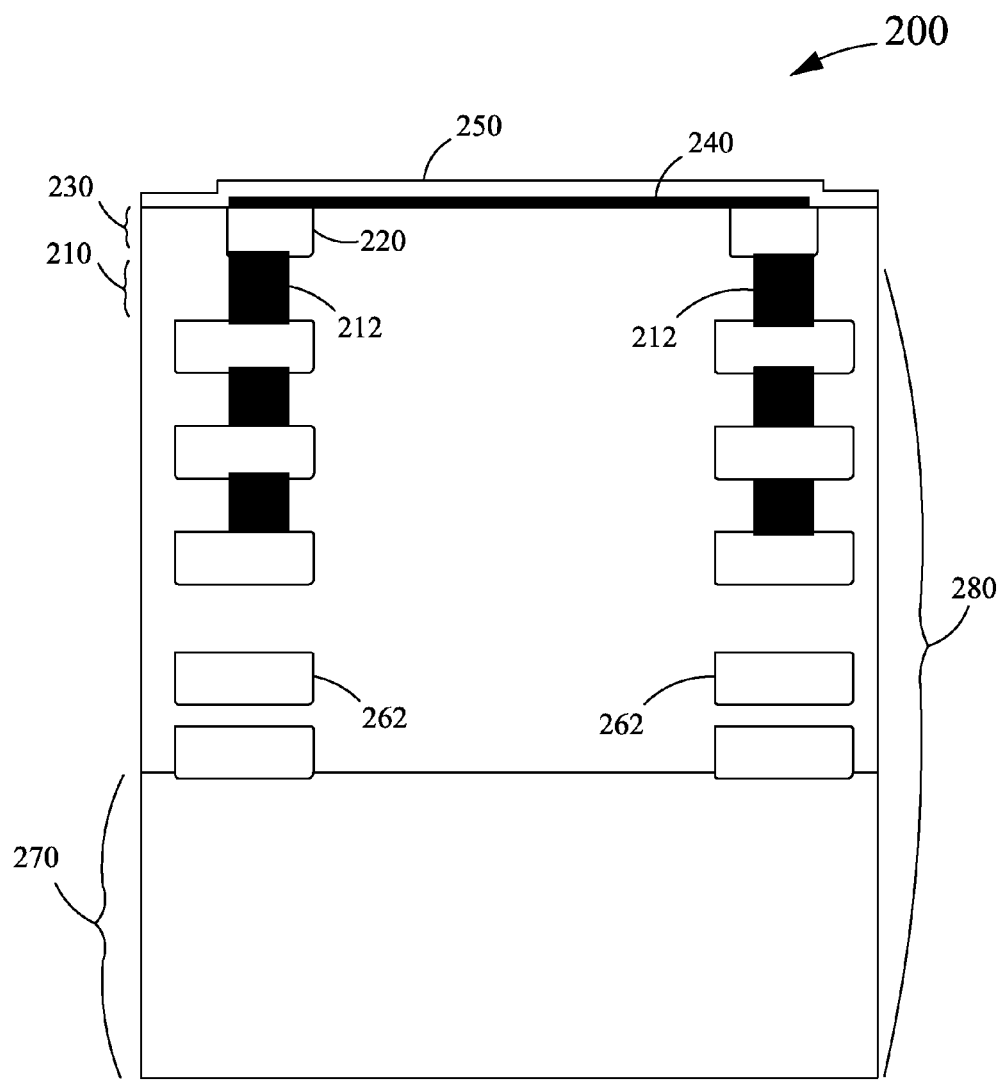
FIG. 9 depicts a partial cross-sectional view of another planar heater structure fabricated using the method of FIG. 1.

FIG. 9 depicts a partial cross-sectional view of another planar heater structure 200 fabricated using the method 10 of FIG. 1. The planar heater structure 200 includes an initial layer 210 of substrate wafer ($SiO_2$ based substrate wafer) including a plurality of plugs 212 (similar to the plugs 112 of FIG. 7) configured therewithin. Each plug of the plugs 212 is formed as an electrical connection and is composed of a first metallic material, such as tungsten.

Further, the planar heater structure 200 includes a layer 220 of a second metallic material (similar to the layer 120 of the second metallic material) deposited and patterned over the initial layer 210 of substrate wafer. In the present embodiment, the second metallic material is aluminum. Furthermore, the planar heater structure 200 includes a layer 230 of a dielectric material (similar to the layer 130 of the dielectric material) of a predetermined thickness provided over the patterned layer 220 of the second metallic material. In the present embodiment, the dielectric material used is $SiO_2$.

It will be evident that the present embodiment utilizes the method 10 by involving CMP of the layer 230 of the dielectric material composed of $SiO_2$ and the patterned layer 220 of the second metallic material coplanar with the layer 230 of the dielectric material, in order to achieve a uniform planarized top surface (not numbered).

Moreover, the planar heater structure 200 includes a resistor film 240 (similar to the resistor film 140) deposited and patterned over the planarized top surface. Specifically, the resistor film 240 is a TaAlN based resistor film. Furthermore, the planar heater structure 200 includes a blanket film 250, such as the blanket film 150 and a blanket film 160, deposited over the patterned resistor film 240.

The planar heater structure 200 also includes additional layers (not numbered) with polymeric plugs, such as a plurality of poly plugs 262 composed of poly-silicon material for a complementary metal-oxide-semiconductor (CMOS) device. Further, various other additional layers (not numbered) may be included underneath the planarized top surface. Furthermore, it will be evident that the additional layers may be layers, such as $SiO_2$ based layers, with corresponding electrical connections (not numbered) and power bus lines/connections (not numbered), based on a manufacturer's preference, to form a heater stack of a requisite thickness. Such electrical connections may be similar to the plugs 212 and may be composed of tungsten; and the power bus lines/connections may be portions of a patterned layer, such as the layer 220 of the second metallic material and may be composed of aluminum. Moreover, the planar heater structure 200 may also include a base 270 composed of silicon to support the aforementioned layers. As evident from FIG. 9, the aforementioned initial layer 210 of substrate wafer along with the additional layers and the base 270 together constitute an entire substrate wafer 280.

In another aspect, the present disclosure provides a method for fabricating a planar heater structure for an ejection device (printhead) of a printer, such as an inkjet printer, in accordance with another embodiment of the present disclosure. The method of the present disclosure is explained in conjunction with FIGS. 10A and 10B. Further, FIGS. 11-17 depict a process flow for fabrication of the planar heater structure using the method of FIGS. 10A and 10B. Specifically, FIGS. 11-17 depict partial cross sectional views for the planar heater structure being fabricated using the method of FIGS. 10A and 10B.

Figure 10A:
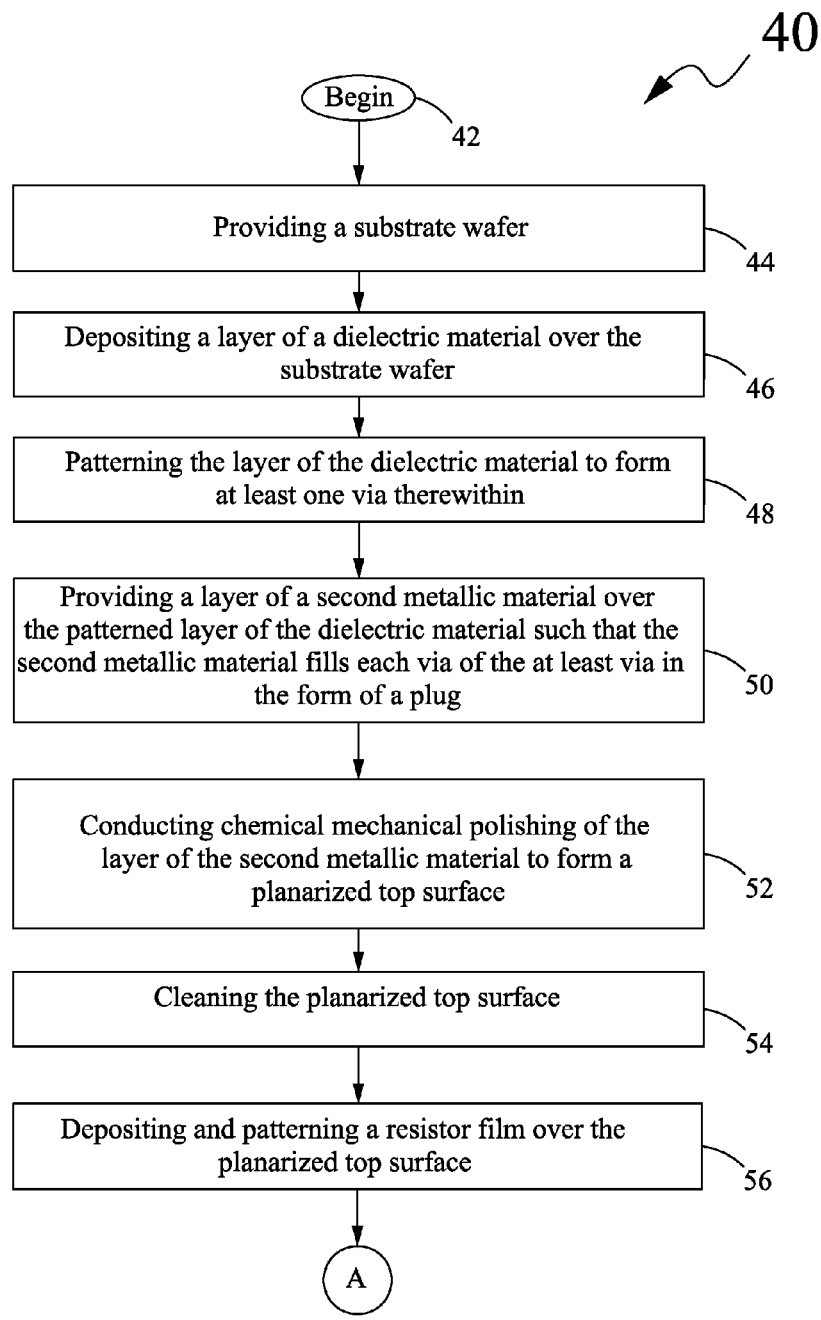
FIGS. 10A and 10B depict a method for fabricating a planar heater structure for an ejection device, in accordance with another embodiment of the present disclosure.
Figure 10B:
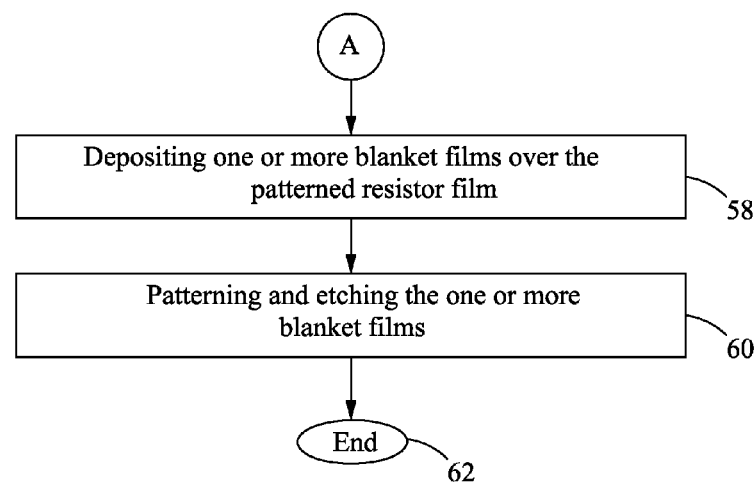
Figure 17:
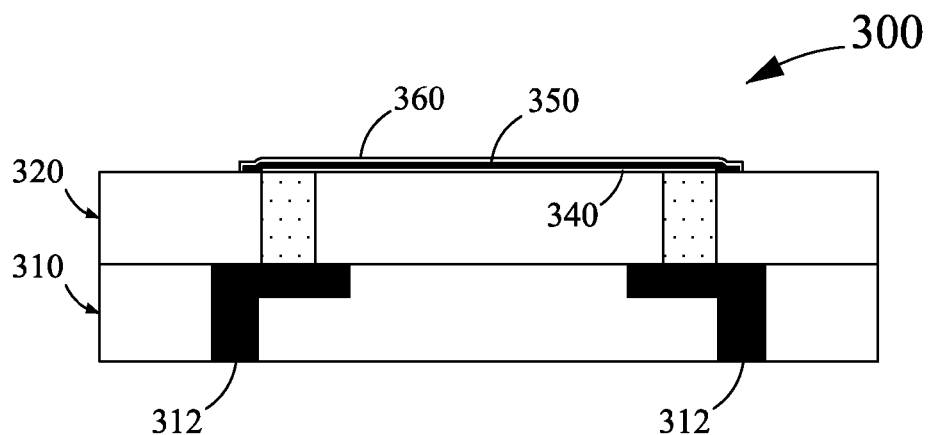

FIGS. 10A and 10B depict a method 40 for fabricating a planar heater structure 300 (as depicted in FIG. 17) for an ejection device, in accordance with another embodiment of the present disclosure. The method begins at 42.

Figure 11:
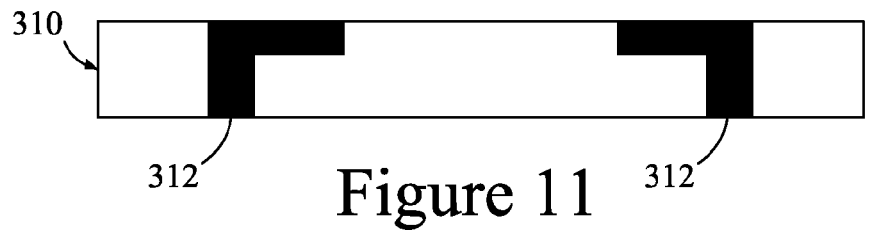
FIGS. 11-17 depict a process flow for fabrication of the planar heater structure using the method of FIGS. 10A and 10B.

At 44, a substrate wafer 310 ($SiO_2$) is provided, as depicted in FIG. 11. The substrate wafer 310 has a planarized $SiO_2$ surface and includes a plurality of electrical connections 312 (metal connections) configured therewithin. Accordingly, the substrate wafer 310 is provided with exposed metal connections that are attached to circuitry in subsequent metallic layers to be disposed beneath the substrate wafer 310.

Each electrical connection of the electrical connections 312 is composed of a first metallic material. In the present embodiment, the first metallic material is aluminum. It will be evident that the each electrical connection of the electrical connections 312 may be composed of any other metallic material and may be configured to have any shape and size as per a manufacturer's preference.

The method 40 may also include deposition of a CMP stop layer (not shown), as known in the art, over the substrate wafer 310 when the first metallic material is aluminum. For example, an oxide layer may be used as the CMP stop layer/protective coating. Accordingly, the substrate wafer 310 may be treated by techniques known in the art to expose the electrical connections 312.

Figure 12:
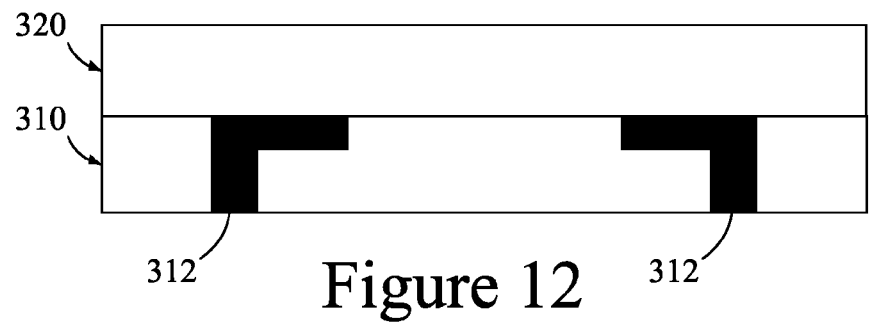

At 46, a layer 320 of a dielectric material is deposited over the substrate wafer 310, as depicted in FIG. 12. Suitable examples of the dielectric material include but are not limited to SOG, MSQ, USG, silicon oxide (for example, $SiO_2$), and such other inter-metal dielectric materials. In the present embodiment, the dielectric material used is silicon oxide ($SiO_2$).

The method 40 may also include conducting CMP of the first metallic material prior to depositing the layer 320 of the dielectric material over the substrate wafer 310.

Figure 13:
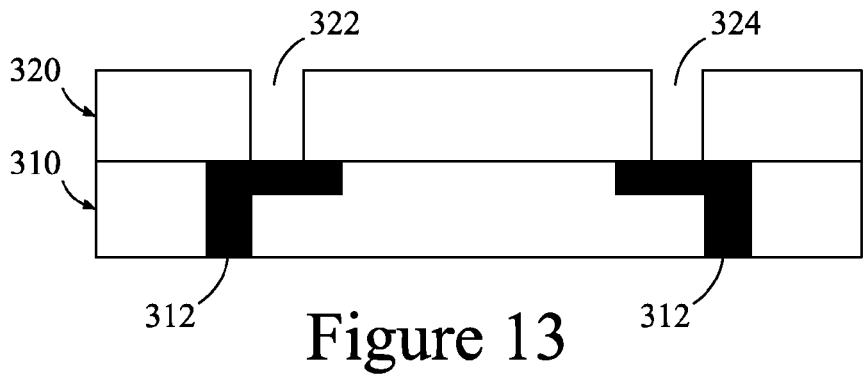

At 48, the layer 320 of the dielectric material is patterned to form at least one via (metal to metal via), such as a via 322 and a via 324 therewithin, as depicted in FIG. 13. Each via of the at least one via is coupled with one or more corresponding electrical connections of the electrical connections 312 configured within the substrate wafer 310. In the present embodiment, only a single via of the at least one via is coupled to a corresponding electrical connection of the electrical connections 312. Further, the layer 320 of the dielectric material is patterned to expose the vias 322 and 324 down to the electrical connections 312. The patterning of the layer 320 of the dielectric material may be achieved by using an appropriate mask, as known in the art and based on a manufacturer's preference.

Figure 14:
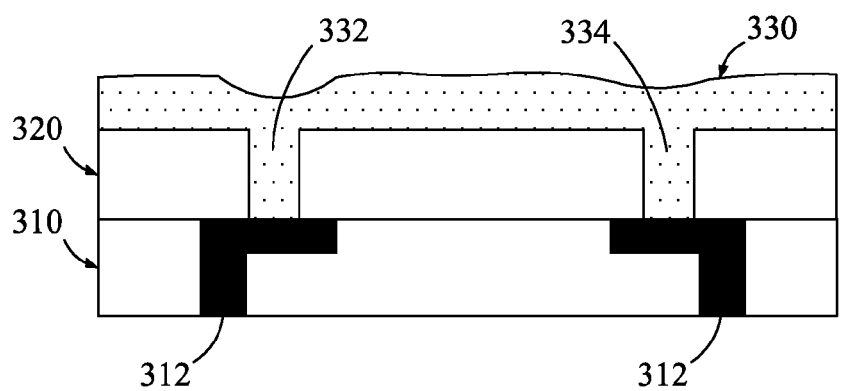

At 50, a layer 330 of a second metallic material is provided over the patterned layer 320 of the dielectric material, such that the second metallic material fills the each via of the at least via in the form of a plug, such as a plug 332 and a plug 334, as depicted in FIG. 14. Specifically, the layer 330 of the second metallic material is sputtered onto the substrate wafer 310, and more specifically, onto the patterned layer 320 of the dielectric material to fill the vias 322 and 324 for making electrical connection. In the present embodiment, the second metallic material is tungsten.

Figure 15:
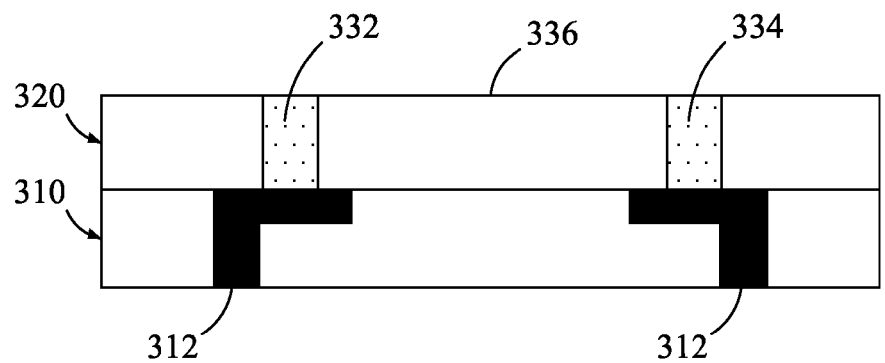

At 52, CMP of the layer 330 of the second metallic material is conducted to form a planarized top surface 336, as depicted in FIG. 15. Specifically, the layer 330 of the second metallic material is removed down up to the layer 320 of the dielectric material by CMP while using a CMP slurry (as known in the art) with a favorable etch selection for the dielectric material.

Figure 16:
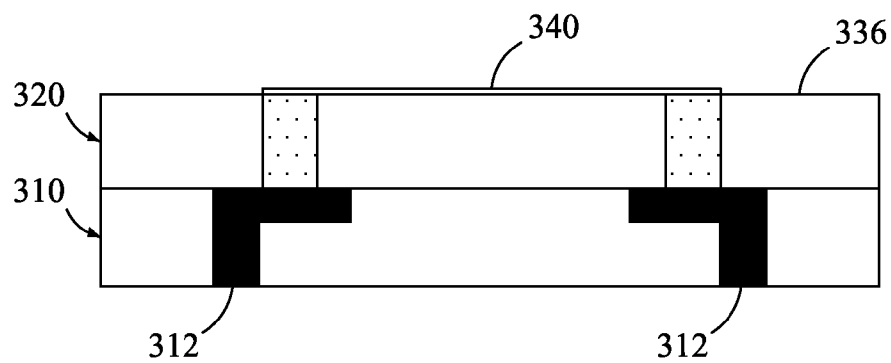

At 54, the planarized top surface 336 is cleaned. At 56, a resistor film 340 is deposited and patterned over the planarized top surface 336, as depicted in FIG. 16. The resistor film 340 may be composed of any material as known in the art. The patterning of the resistor film 340 may be achieved using an appropriate mask, as known in the art and based on a manufacturer's preference.

At 58, one or more blanket films, such as a blanket film 350 and a blanket film 360, are deposited over the patterned resistor film 340. At 60, the one or more blanket films are then patterned and etched, as depicted in FIG. 17. Each blanket film of the one or more blanket films is one of silicon based blanket film, composed of materials such as silicon and SiN; and tantalum based blanket film, composed of materials such as Ta. Further, the blanket film 350 and the blanket film 360 may be patterned and etched either simultaneously or independently. Accordingly, the patterning of the blanket film 350 and the blanket film 360 may be achieved by using one or more appropriate masks, as known in the art and based on a manufacturer's preference.

Further, a protective overcoat (PO) layer (not shown) composed of materials, such as silicon carbide and the like, may be deposited and patterned over the one or more blanket films based on a manufacturer's preference.

The method 40 ends at 62. Based on the foregoing, the method 40 is a process flow involving planarization of tungsten.

Figure 18:
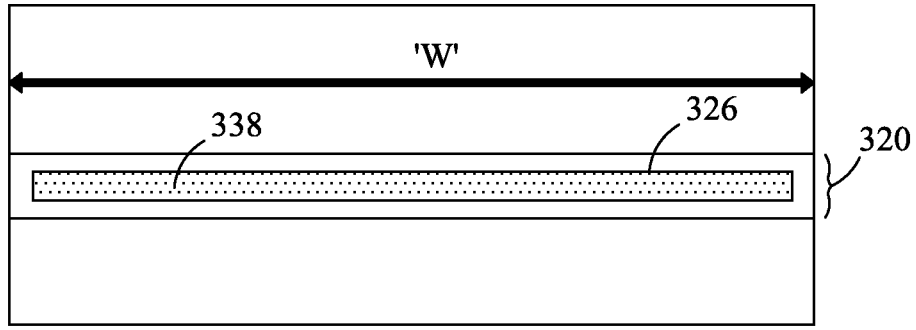
FIG. 18 depicts a top view of an elongated via (filled with a conductive material) within a layer of a dielectric material of the planar heater structure of FIG. 17, in accordance with an embodiment of the present disclosure.

As depicted in FIG. 18 and for illustrative purposes, the layer 320 of the dielectric material may be patterned to form one or more elongated vias, such as an elongated via 326, arranged in a row (not numbered) and filled with a conductive material. Further, the second metallic material fills each elongated via of the one or more elongated vias in the form of an elongated bar-shaped plug, such as a plug 338. The each elongated via may extend as a continuous bar (with dimensions, such as 10.55 units of length and 0.4 units of width/breadth) along width 'W' of the heater resistor (constituted by the resistor film 340) of the planar heater structure 300. Alternatively, the layer 320 of the dielectric material may be patterned to form multiple elongated vias 326, arranged in two or more parallel rows (not shown). Such an arrangement needs a small overlap at side portions due to design rules based on manufacturing and to seal an area corresponding to the elongated vias 326. It should be understood that the aforementioned dimensions and distance should not be considered as a limitation of the present disclosure. Further, the units for the aforementioned dimensions and distance may be in microns.

Figure 19:
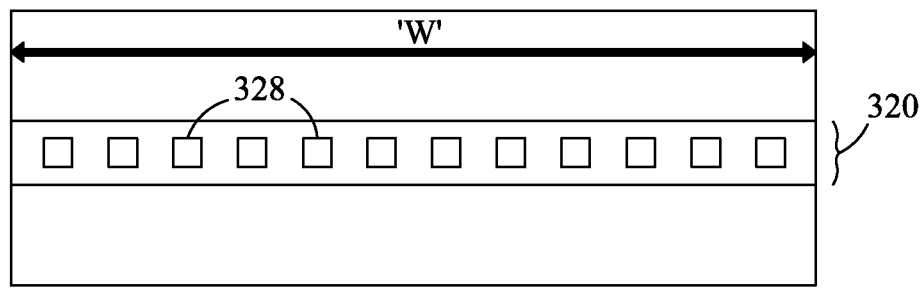
FIG. 19 depicts a top view for an arrangement of a plurality of short vias (filled with a conductive material) within a layer of a dielectric material of the planar heater structure of FIG. 17, in accordance with another embodiment of the present disclosure.
Figure 20:
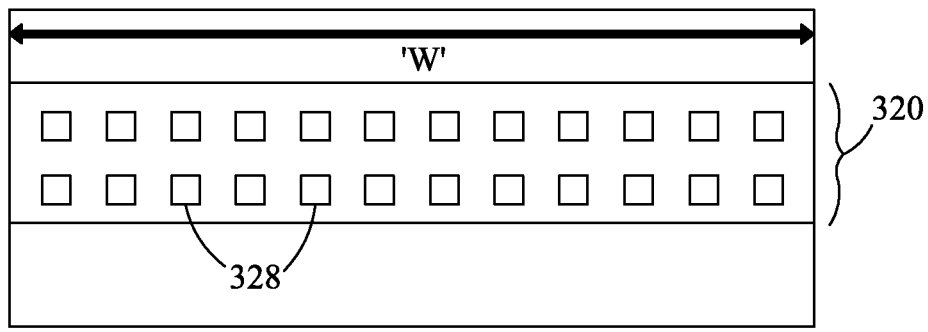
FIG. 20 depicts a top view for another arrangement of a plurality of short vias (filled with a conductive material) within a layer of a dielectric material of the planar heater structure of FIG. 17, in accordance with yet another embodiment of the present disclosure.

Further, the layer 320 of the dielectric material may be patterned to form a plurality of short vias 328 (filled with a conductive material) that is arranged either in a single row (not numbered) along the width 'W' of the heater resistor of the planar heater structure 300, as depicted in FIG. 19, or in two or more parallel rows (not numbered) along the width 'W' of the heater resistor of the planar heater structure 300, as depicted in FIG. 20. The short vias 328 are arranged based on widths with minimum design rules. Specifically, each via of the short vias 328 may be in the form of a square having dimensions, such as 0.4 units of length and 0.4 units of width/breadth, and may be separated from an adjacent via of either the same row or an adjacent row at a distance of about 0.5 units. However, the aforementioned dimensions and distance should not be considered as a limitation to the present disclosure. Further, the units for the aforementioned dimensions and distance may be in microns. Based on such an arrangement, the second metallic material fills each short via of the short vias 328 in the form of a short plug (not numbered).

Figure 21:
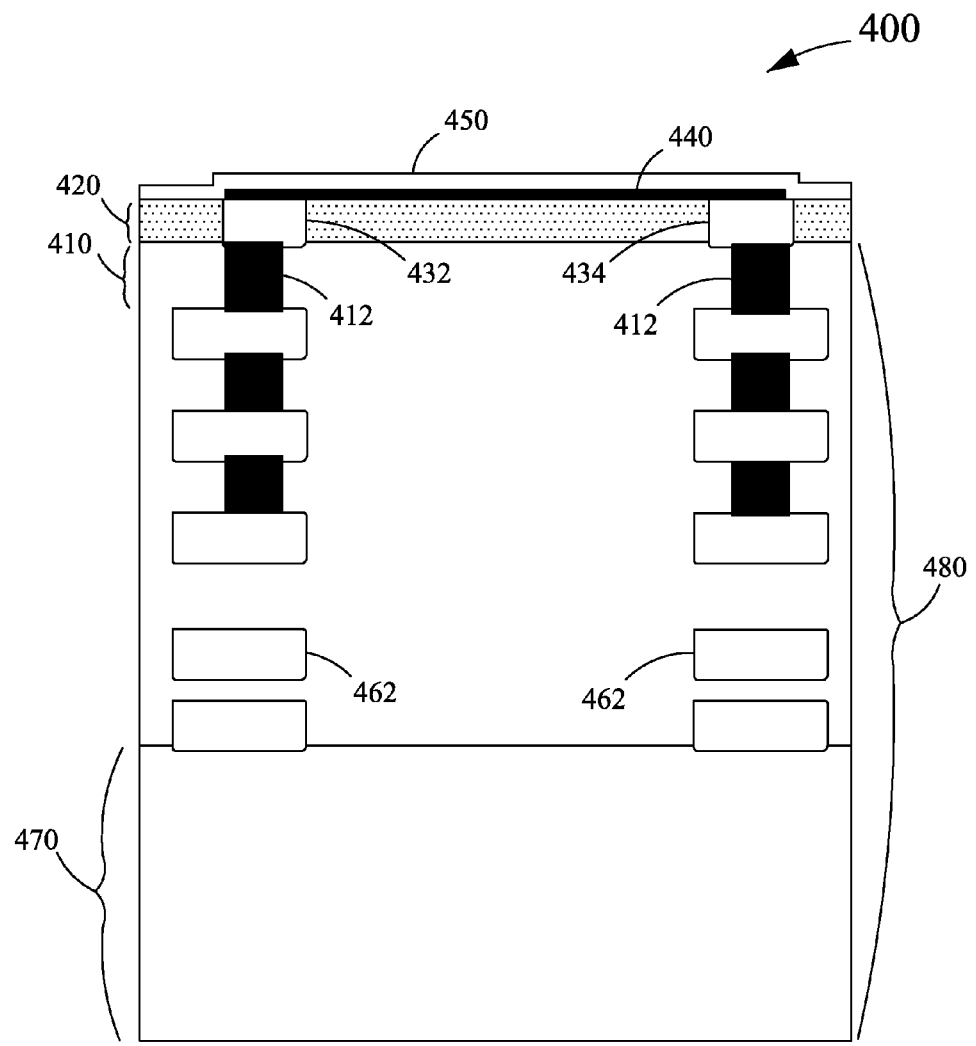
FIG. 21 depicts a partial cross-sectional view of another planar heater structure fabricated using the method of FIGS. 10A and 10B.

FIG. 21 depicts a partial cross-sectional view of another planar heater structure 400 fabricated using the method 40 of FIGS. 10A and 10B. The planar heater structure 400 includes an initial layer 410 of substrate wafer (SiO$_2$) including a plurality of electrical connections 412, similar to the electrical connections 312 of FIG. 17, configured therewithin. Accordingly, the initial layer 410 of substrate wafer is provided with exposed metal connections that are attached to circuitry in subsequent metallic layers to be disposed beneath the initial layer 410 of substrate wafer. Each electrical connection of the electrical connections 412 is composed of a first metallic material. In the present embodiment, the first metallic material is tungsten. It may be evident that CMP of the first metallic material may be required to achieve planarity.

Further, the planar heater structure 400 includes a layer 420 of a dielectric material, similar to the layer 320 of the dielectric material, deposited over the initial layer 410 of substrate wafer. Suitable examples of the dielectric material include but are not limited to SOG, MSQ, USG, silicon oxide (for example, SiO$_2$), and such other inter-metal dielectric materials. In the present embodiment, the dielectric material used is MSQ. Using the method 40, the layer 420 of the dielectric material is patterned to form at least one via (not numbered), similar to the via 322 and the via 324 of FIG. 13.

Furthermore, the planar heater structure 400 includes at least one plug, such as a plug 432 and a plug 434 (similar to the plugs 332 and 334 of FIG. 14). Specifically, while fabricating the planar heater structure 400 using the method 40, a layer of a second metallic material (not shown), similar to the layer 330 of the second metallic material, is provided over the patterned layer 420 of the dielectric material, such that the second metallic material fills each via of the at least via in the form of a plug, such as the plugs 432 and 434. Also, the layer of the second metallic material is allowed to undergo CMP to form a planarized top surface (not numbered) and to expose the plugs 432 and 434. A suitable example of the second metallic material includes, but is not limited to, aluminum.

Additionally, the planar heater structure 400 includes a resistor film 440, similar to the resistor film 340, deposited and patterned over the planarized top surface. Specifically, the resistor film 440 may be a TaAlN based resistor film. Moreover, the planar heater structure 400 includes a blanket film 450, similar to the blanket film 350 and the blanket film 360, deposited over the resistor film 440. Specifically, the blanket film 450 may either be a Si based blanket film, a Ta based blanket film, or a combination thereof.

In addition, the planar heater structure 400 includes additional layers (not numbered) with polymeric plugs, such as a plurality of poly plugs 462. Further, various other additional layers (not numbered) may be included underneath the planarized top surface. Furthermore, it will be evident that the additional layers may be layers, such as $SiO_2$ based layers, with corresponding electrical connections (not numbered) and power bus lines/connections (not numbered), based on a manufacturer's preference, to form a heater stack of a requisite thickness. Such electrical connections may be similar to the electrical connections 412 and may be composed of tungsten; and the power bus lines/connections may be portions of a patterned layer, such as the layer of the second metallic material and may be composed of aluminum. Moreover, the planar heater structure 400 may also include a base 470 composed of silicon to support the aforementioned layers. As evident from FIG. 21, the aforementioned initial layer 410 of substrate wafer along with the additional layers and the base 470 together constitute an entire substrate wafer 480.

Figure 22:
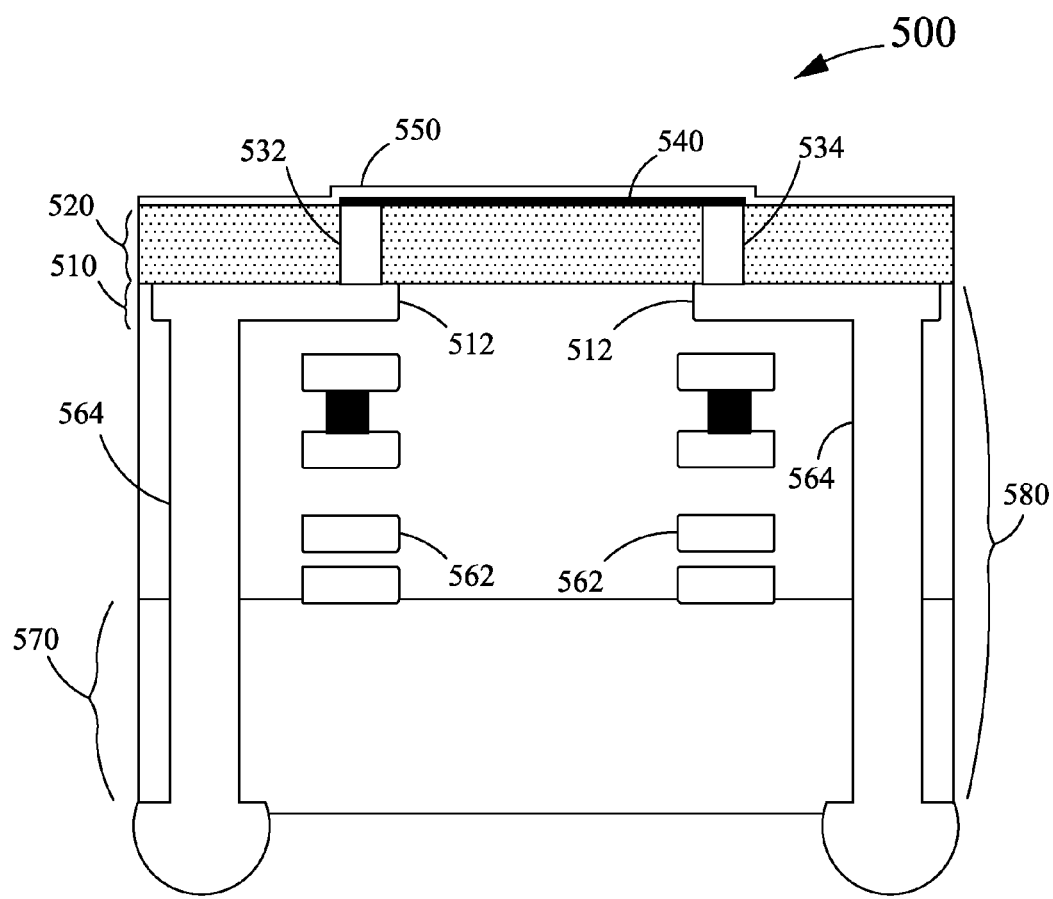
FIG. 22 depicts a partial cross-sectional view of yet another planar heater structure fabricated using the method of FIGS. 10A and 10B.

FIG. 22 depicts a partial cross-sectional view of yet another planar heater structure 500, similar to the planar heater structure 400, fabricated using the method of FIGS. 10A and 10B. The planar heater structure 500 includes an initial layer 510 of substrate wafer ($SiO_2$), similar to the initial layer 410 of substrate wafer and the substrate wafers 310, and including a plurality of electrical connections 512, similar as the electrical connections 312 of FIG. 17 and the electrical connections 412 of FIG. 21, configured therewithin. Accordingly, the initial layer 510 of substrate wafer is provided with exposed metal connections that are attached to circuitry in subsequent metallic layers to be disposed beneath the initial layer 510 of substrate wafer. Each electrical connection of the electrical connections 512 is composed of a first metallic material. In the present embodiment, the first metallic material is aluminum. Further, the each electrical connection of the electrical connections 512 may be configured and extended through the planar heater structure 500 to form a through-silicon via 564 (serving as a thermal conductor for an entire substrate wafer 580) and a bump structure (not numbered) beneath the entire substrate wafer 580, as depicted in FIG. 22.

Further, the planar heater structure 500 includes a layer 520 of a dielectric material, similar to the layer 320 of the dielectric material and the layer 420 of the dielectric material, deposited over the initial layer 510 of substrate wafer. Suitable examples of the dielectric material include but are not limited to SOG, MSQ, USG, silicon oxide (for example, $SiO_2$), and such other inter-metal dielectric materials. In the present embodiment, the dielectric material used is MSQ. Using the method 40, the layer 520 of the dielectric material is patterned to form at least one via (not numbered), such as the via 322 and the via 324 of FIG. 13.

Furthermore, the planar heater structure 500 includes at least one plug, such as a plug 532 and a plug 534 (similar to the plugs 332 and 334 of FIG. 14 and the plugs 432 and 434 of FIG. 21). Specifically, while fabricating the planar heater structure 500 using the method 40, a layer of a second metallic material, similar to the layer 330 of the second metallic material, is provided over the patterned layer 520 of the dielectric material, such that the second metallic material fills each via of the at least via in the form of a plug, such as the plugs 532 and 534. Also, the layer of the second metallic material is allowed to undergo CMP to form a planarized top surface (not numbered) and to expose the plugs 532 and 534. A suitable example of the second metallic material includes, but is not limited to, tungsten.

Additionally, the planar heater structure 500 includes a resistor film 540, similar to the resistor films 340 and 440, deposited and patterned over the planarized top surface. Moreover, the planar heater structure 500 includes a blanket film 550, similar to the blanket film 450, deposited over the resistor film 540.

In addition, the planar heater structure 500 includes additional layers (not numbered) with polymeric plugs, such as a plurality of poly plugs 562. Further, various other additional layers (not numbered) may be included underneath the planarized top surface. Furthermore, it will be evident that the additional layers may be layers, such as $SiO_2$ based layers, with corresponding electrical connections (not numbered) and power bus lines/connections (not numbered), based on a manufacturer's preference, to form a heater stack of a requisite thickness. Such electrical connections may be similar to the electrical connections 512 and may be composed of aluminum; and the power bus lines/connections may be portions of a patterned layer, such as the layer of the second metallic material and may be composed of tungsten. Moreover, the planar heater structure 500 may also include a base 570 composed of silicon to support the aforementioned layers. As evident from FIG. 22, the aforementioned initial layer 510 of substrate wafer along with the additional layers and the base 570 together constitute the entire substrate wafer 580.

In yet another aspect, the present disclosure provides a method for fabricating a planar heater structure for an ejection device (printhead) of a printer, such as an inkjet printer, in accordance with yet another embodiment of the present disclosure. The method of the present disclosure is explained in conjunction with FIGS. 23A and 23B. Further, FIGS. 24-30 depict a process flow for fabrication of the planar heater structure using the method of FIGS. 23A and 23B. Specifically, FIGS. 24-30 depict partial cross sectional views for the planar heater structure being fabricated using the method of FIGS. 23A and 23B.

Figure 23A:
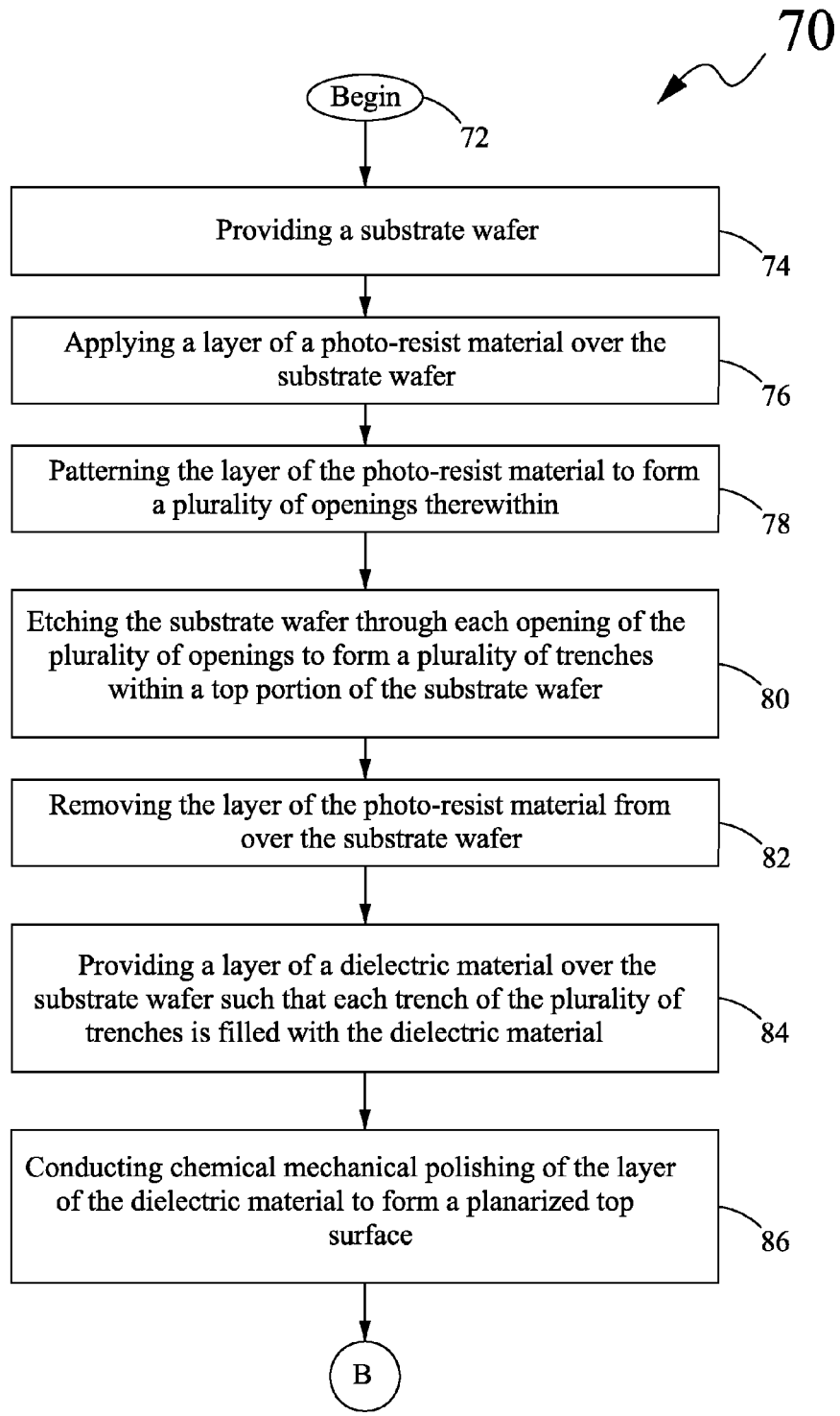
FIGS. 23A and 23B depict a method for fabricating a planar heater structure for an ejection device, in accordance with yet another embodiment of the present disclosure.
Figure 23B:
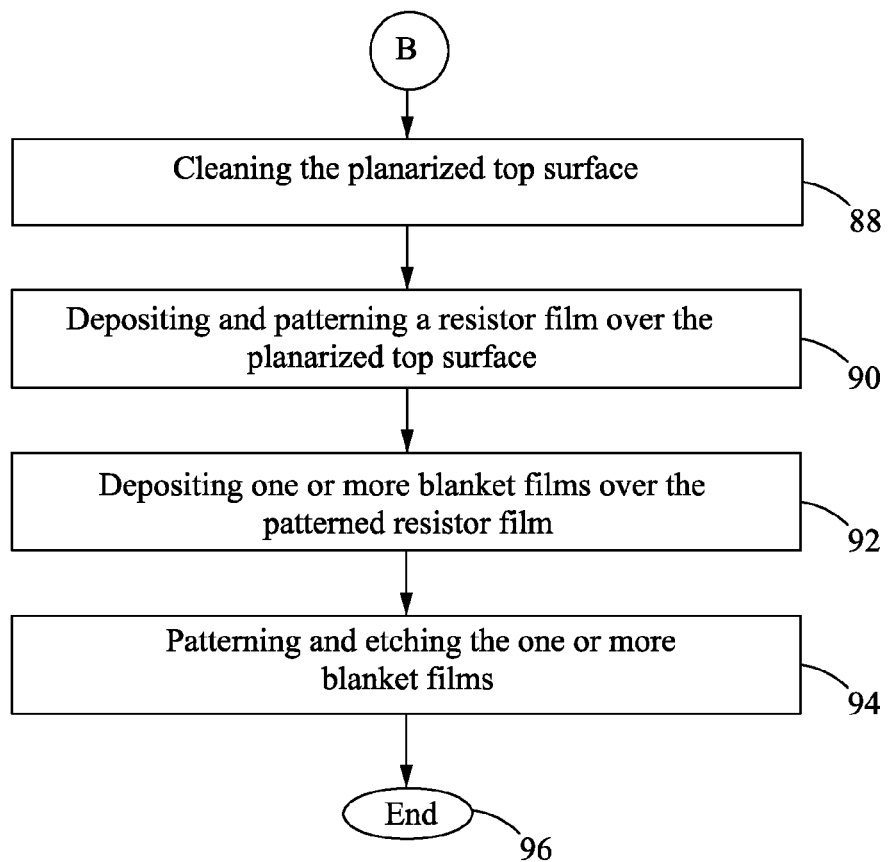
Figure 30:
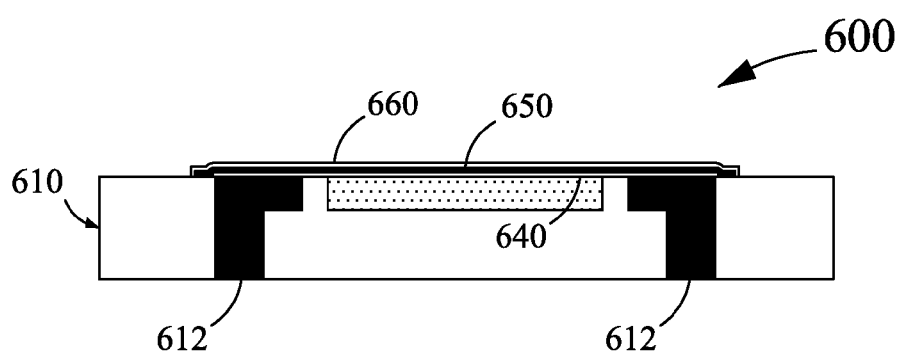

FIGS. 23A and 23B depict a method 70 for fabricating a planar heater structure 600, as depicted in FIG. 30, for an ejection device, in accordance with yet another embodiment of the present disclosure. The method 70 begins at 72.

Figure 24:
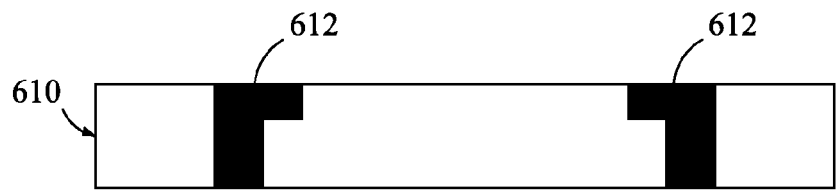
FIGS. 24-30 depict a process flow for fabrication of the planar heater structure using the method of FIGS. 23A and 23B.

At 74, a substrate wafer 610 ($SiO_2$), is provided, (as depicted in FIG. 24). The substrate wafer 610 has a planarized $SiO_2$ surface and includes a plurality of electrical connections 612 (metal connections) configured therewithin. Accordingly, the substrate wafer 610 is provided with exposed metal connections that are attached to circuitry in subsequent metallic layers to be disposed beneath the substrate wafer 610. Each electrical connection of the electrical connections 612 is composed of a metallic material (first metallic material). The metallic material of the each electrical connection is one of aluminum and tungsten. For the present disclosure, the each electrical connection is composed of aluminum. It will be evident that the each electrical connection of the electrical connections 612 may be composed of any other metallic material and may be configured to have any shape and size as per a manufacturer's preference.

Further, the method 70 may further include treating the substrate wafer 610 to expose the electrical connections 612 when a protective layer/coating (such as an oxide coating) is present on the substrate wafer 610. Specifically, the substrate wafer 610 may be treated by techniques known in the art to expose the electrical connections 612. Furthermore, a thin layer of a heater film, such as a heater film composed of TaAlN and the like, may be deposited over the substrate wafer 610 as an etch stop layer to protect the electrical connections 612, if required.

Figure 25:
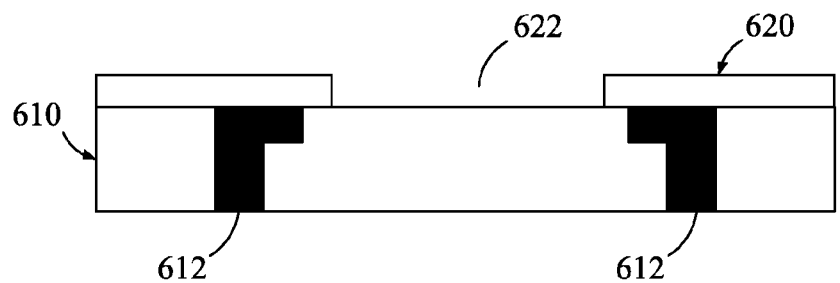

At 76, a layer 620 of a photo-resist material is applied over the substrate wafer 610 to pattern a trench area (not numbered). Specifically, at 78, the layer 620 of the photo-resist material is patterned to form a plurality of openings, such as an opening 622, therewithin, as depicted in FIG. 25. It will be evident that the layer 620 of the photo-resist material may be spun on the substrate wafer 610 and then patterned by using an appropriate mask (one mask step), as known in the art and based on a manufacturer's preference. Further, the layer 620 of the photo-resist material may be composed of a suitable photo-resist material as known in the art.

The method 70 may also include conducting CMP of the metallic material as used for the electrical connections 612, prior to applying the layer 620 of the photo-resist material over the substrate wafer 610.

Figure 26:
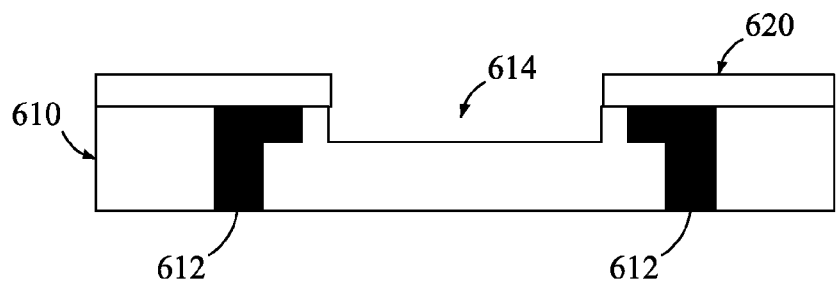

At 80, the substrate wafer 610 is etched through each opening of the plurality of openings, such as the opening 622, to form a plurality of trenches, such as a trench 614, within a top portion (not numbered) of the substrate wafer 610, as depicted in FIG. 26. Specifically, the substrate wafer 610 is etched using controlled dry etch to form the trench 614. At 82, the layer 620 of the photo-resist material is removed from over the substrate wafer 610.

Figure 27:
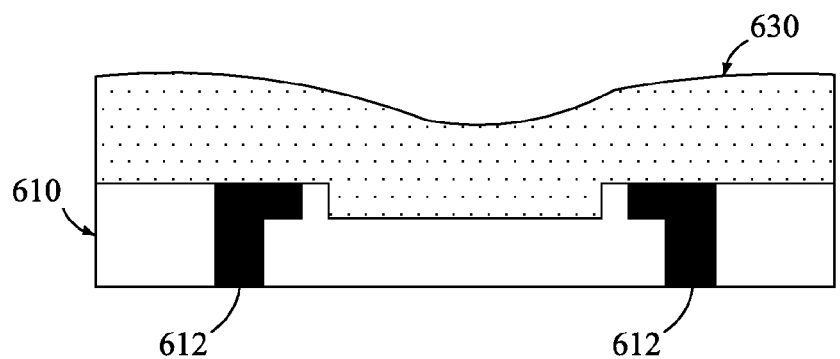

At 84, a layer 630 of a dielectric material is provided over the substrate wafer 610 such that each trench of the plurality of trenches, such as the trench 614, is filled with the dielectric material, as depicted in FIG. 27. Suitable examples of the dielectric material include but are not limited to SOG, MSQ, USG, silicon oxide (for example, $SiO_2$), and such other inter-metal dielectric materials. For the present embodiment, MSQ is used as the dielectric material. Specifically, the layer 630 of the dielectric material may be either spun or deposited up to a predetermined thickness, such as 3×, relative to the thickness of the electrical connections 612 in order to allow a uniform/even coverage of the substrate wafer 610 in preparation for CMP.

Figure 28:
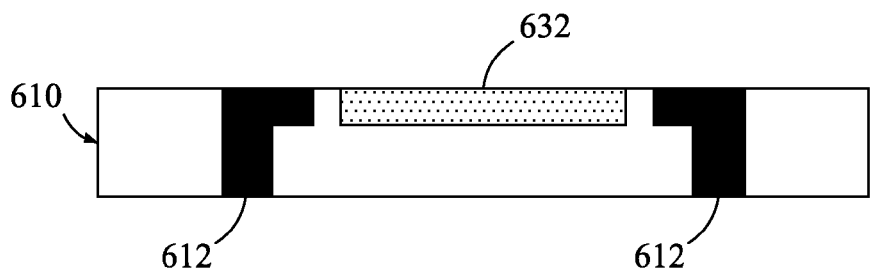

At 86, CMP of the layer 630 of the dielectric material is conducted to expose the each electrical connection of the electrical connections 612 of the substrate wafer 610 and to form a planarized top surface 632, as depicted in FIG. 28. When the protective layer composed of materials such as Ta, TaN, Ti, TiN and the like, other than TaAlN is deposited over the substrate wafer 610, a light sputter etch may be performed to remove the protective layer in order to remove ceramic for making electrical contact with the power bus lines and the connections. However, when the protective layer composed of TaAlN is deposited over the substrate wafer 610 layer, the protective layer may be retained over the substrate wafer 610. It will be evident that the layer 630 of the dielectric material may also be patterned after conducting CMP, if required.

At 88, the planarized top surface 632 is cleaned.

Figure 29:
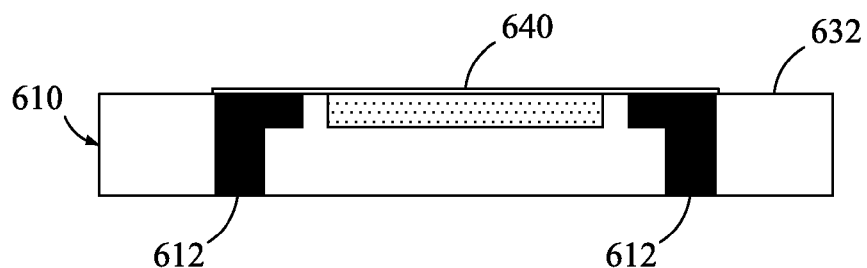

At 90, a resistor film 640 is deposited and patterned over the planarized top surface 632, as depicted in FIG. 29. The resistor film 640 may be composed of any material as known in the art. The patterning of the resistor film 640 may be achieved using an appropriate mask (second mask step), as known in the art and based on a manufacturer's preference.

At 92, one or more blanket films, such as a blanket film 650 (such as a SiN film) and a blanket film 660 (such as a Ta film), are deposited over the resistor film 640. At 94, the one or more blanket films are patterned and etched, as depicted in FIG. 30. Each blanket film of the one or more blanket films is one of silicon based blanket film, composed of materials such as silicon and SiN; and tantalum based blanket film, composed of materials such as Ta. Further, the blanket film 650 and the blanket film 660 may be patterned and etched either simultaneously or independently. Accordingly, the patterning of the blanket film 650 and the blanket film 660 may be achieved by using one or more appropriate masks, as known in the art and based on a manufacturer's preference.

Further, a protective overcoat (PO) layer (not shown) composed of materials, such as silicon carbide and the like, may be deposited and patterned over the one or more blanket films based on a manufacturer's preference.

The method 70 ends at 96. Based on the foregoing, the method 70 is a process flow involving planarization of MSQ.

Figure 31:
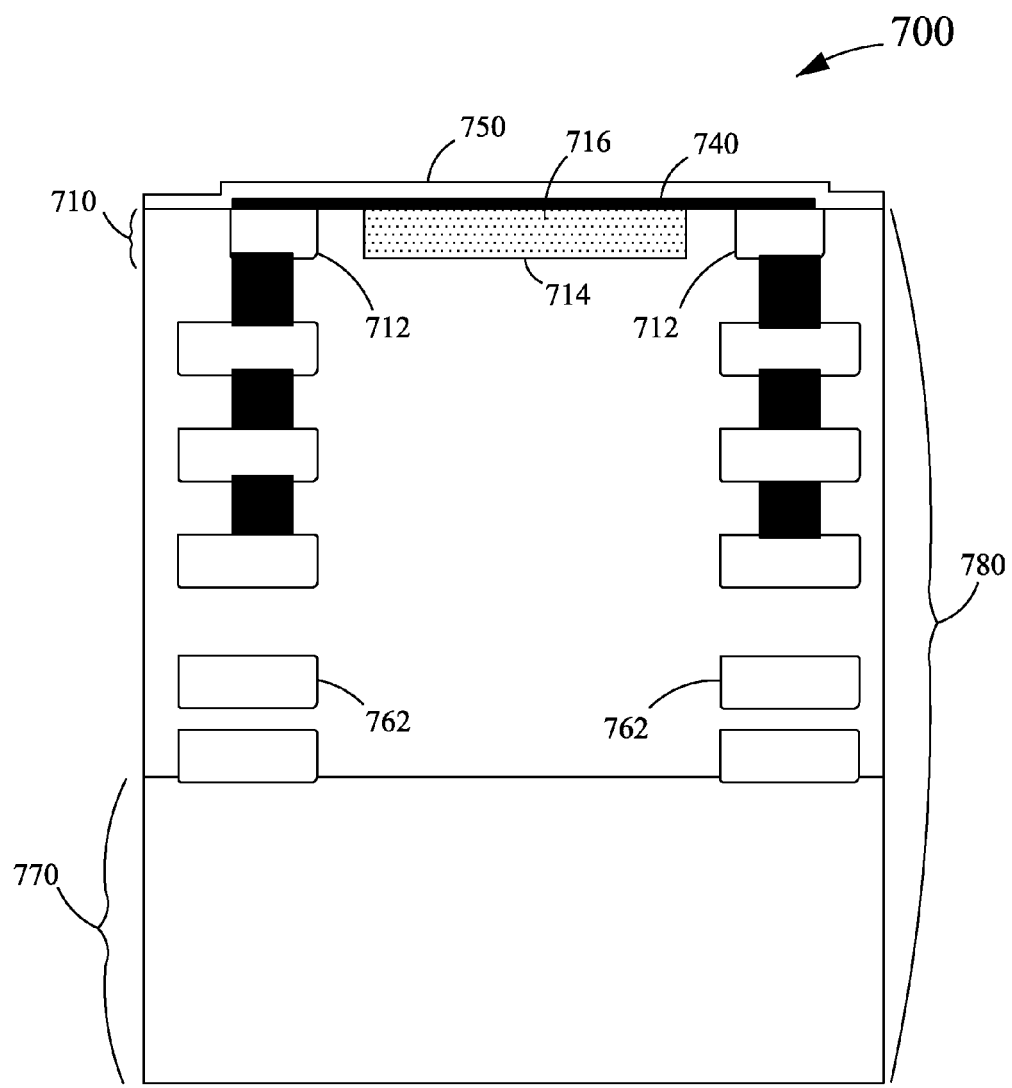
FIG. 31 depicts a partial cross-sectional view of another planar heater structure fabricated using the method of FIGS. 23A and 23B.

FIG. 31 depicts a partial cross-sectional view of another planar heater structure 700 fabricated using the method 70 of FIGS. 23A and 23B. The planar heater structure 700 is similar to the planar heater structure 600, and includes an initial layer 710 of substrate wafer ($SiO_2$ based substrate wafer) including a plurality of electrical connections 712 (similar to the electrical connections 612 of FIG. 24) configured therewithin. Each electrical connection of the electrical connections 712 is composed of a metallic material (first metallic material), such as aluminum. The metallic material may also be allowed to undergo CMP prior to applying a layer of a photo-resist material, similar to the layer 620 of the photo-resist material, over the initial layer 710 of substrate wafer. The application of the layer of the photo-resist material assists in configuring a plurality of trenches, such as a trench 714, within the initial layer 710 of substrate wafer. The trench 714 is filled with a dielectric material (depicted as a portion 716 of a layer of a dielectric material). Suitable examples of the dielectric material include, but are not limited to, SOG, MSQ, USG, silicon oxide (for example, $SiO_2$), and such other inter-metal dielectric materials. In the present embodiment, the dielectric material used is MSQ. Specifically, a layer of MSQ, similar to the layer 630 of dielectric material, may be deposited over the initial layer 710 of substrate wafer (without any layer of the photo-resist material thereupon), and may be allowed to undergo CMP to yield a planarized top surface (not numbered).

The planar heater structure 700 also includes a resistor film 740 deposited and patterned over the planarized top surface (not numbered), of the planar heater structure 700. The resistor film 740 may be composed of TaAlN. Moreover, the planar heater structure 700 includes one or more blanket films, such as a blanket film 750 (such as Si film, SiN film and Ta film), deposited over the resistor film 740. The one or more blanket films may be patterned and etched, as required. Further, a protective overcoat (PO) layer (not shown) composed of materials, such as silicon carbide and the like, may be deposited and patterned over the one or more blanket films based on a manufacturer's preference.

Accordingly and similar to the planar heater structure 600, fabrication of the planar heater structure 700 employs planarization of MSQ as described in conjunction with the method 70.

Additionally, the planar heater structure 700 includes additional layers (not numbered) with polymeric plugs, such as a plurality of poly plugs 762. Further, various additional layers (not numbered) may be included underneath the planar heater surface. Furthermore, it will be evident that the additional layers may be layers, such as $SiO_2$ based layers, with corresponding electrical connections (not numbered) and power bus lines/connections (not numbered), based on a manufacturer's preference, to form a heater stack of a requisite thickness. Such electrical connections may be similar to the electrical connections 712 and may be composed of aluminum/tungsten. Moreover, the planar heater structure 700 may also include a base 770 composed of silicon to support the aforementioned layers. As evident from FIG. 31, the aforementioned initial layer 710 of substrate wafer along with the additional layers and the base 770 together constitute an entire substrate wafer 780.

Figure 32:
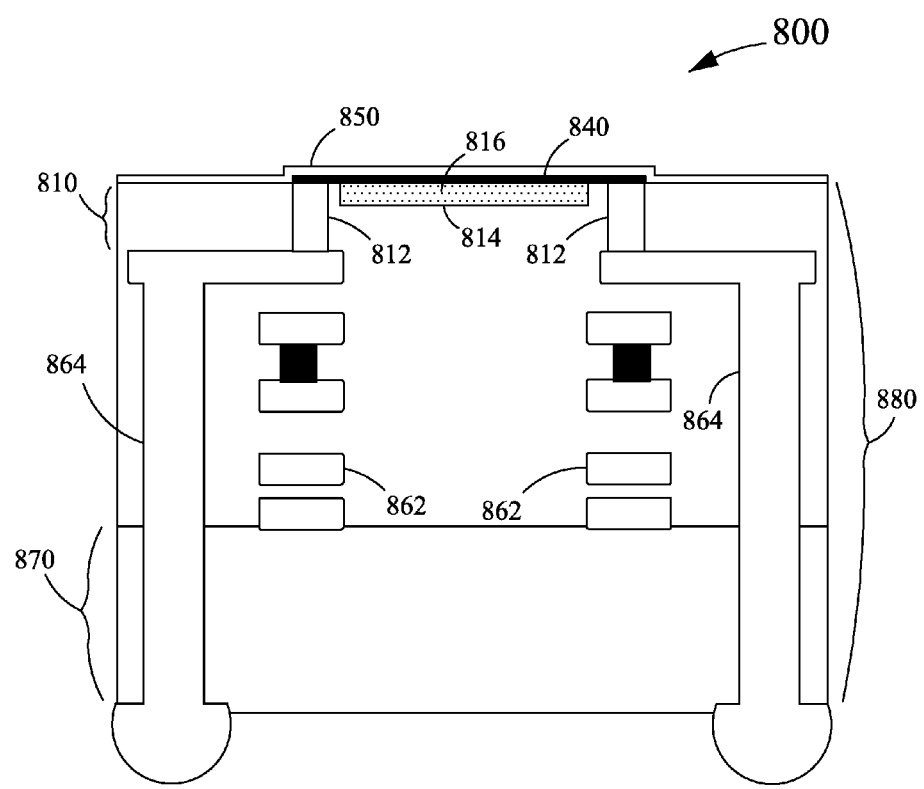
FIG. 32 depicts a partial cross-sectional view of yet another planar heater structure fabricated using the method of FIGS. 23A and 23B.

FIG. 32 depicts a partial cross-sectional view of another planar heater structure 800 fabricated using the method 70 of FIGS. 23A and 23B. The planar heater structure 800 is similar to the planar heater structures 600 and 700, and includes an initial layer 810 of substrate wafer ($SiO_2$ based substrate wafer) including a plurality of electrical connections 812 (similar to the electrical connections 612 and 712) configured therewithin. Each electrical connection of the electrical connections 812 is composed of a metallic material (first metallic material), such as tungsten. The metallic material may also be allowed to undergo CMP prior to applying a layer of a photo-resist material, similar to the layer 620 of the photo-resist material, over the initial layer 810 of substrate wafer. The application of the layer of the photo-resist material assists in configuring a plurality of trenches, such as a trench 814, within the initial layer 810 of substrate wafer. The trench 814 is filled with a dielectric material (depicted as a portion 816 of a layer of a dielectric material). Suitable examples of the dielectric material include, but are not limited to, SOG, MSQ, USG, silicon oxide (for example, $SiO_2$), and such other inter-metal dielectric materials. In the present embodiment, the dielectric material used is MSQ. Specifically, a layer of MSQ, similar to the layer 630 of the dielectric material, may be deposited over the initial layer 810 of substrate wafer (without any layer of the photo-resist material thereupon), and may be allowed to undergo CMP to yield a planarized top surface (not numbered).

As depicted in FIG. 32, the each electrical connection of the electrical connections 812 may also be configured and extended through the planar heater structure 800 to form a through-silicon via 864 (serving as a thermal conductor for an entire substrate wafer 880) and a bump structure (not numbered) beneath the entire substrate wafer 880.

The planar heater structure 800 also includes a resistor film 840 deposited and patterned over the planarized top surface (not numbered), of the planar heater structure 800. The resistor film 840 may be composed of TaAlN. Moreover, the planar heater structure 800 includes one or more blanket films, such as a blanket film 850 (such as Si film, SiN film and Ta film) deposited over the resistor film 840. The one or more blanket films may be patterned and etched, as required. Further, a protective overcoat (PO) layer (not shown) composed of materials, such as silicon carbide and the like, may be deposited and patterned over the one or more blanket films based on a manufacturer's preference.

Accordingly and similar to the planar heater structures 600 and 700, fabrication of the planar heater structure 800 employs planarization of MSQ as described in conjunction with the method 70.

Additionally, the planar heater structure 800 includes additional layers (not numbered) with polymeric plugs, such as a plurality of poly plugs 862. Further, various other additional layers (not numbered) may be included underneath the planarized top surface. Further, it will be evident that the additional layers may be layers, such as $SiO_2$ based layers, with corresponding electrical connections (not numbered) and power bus lines/connections (not numbered), based on a manufacturer's preference, to form a heater stack of a requisite thickness. Such electrical connections may be similar to the electrical connections 812 and may be composed of aluminum/tungsten. Moreover, the planar heater structure 800 may also include a base 870 composed of silicon to support the aforementioned layers. As evident from FIG. 32, the aforementioned initial layer 810 of substrate wafer along with the additional layers and the base 870 together constitute the entire substrate wafer 880.

In still another aspect, the present disclosure provides a planar heater structure, such as the planar heater structures 100, 200, 300, 400, 500, 600, 700 and 800, for an ejection device. The planar heater structure includes a substrate wafer (such as the substrate wafers 110, 280, 310, 480, 580, 610, 780 and 880) including a plurality of electrical connections configured therewithin. Each electrical connection of the plurality of electrical connections is composed of a first metallic material, such as aluminum and tungsten. Further, the planar heater structure includes a layer of a dielectric material (such as the layers 130 and 630 of the dielectric materials, and the like) disposed one of over the substrate wafer and within a top portion of the substrate wafer. The planar heater structure also includes a planarized top surface (such as the planarized top surfaces 132, 232, and the like) configured over the substrate wafer and the layer of the dielectric material by CMP. Furthermore, the planar heater structure includes a resistor film (such as the resistor films 140, 340, 640 and the like) disposed over one of the substrate wafer and the layer of the dielectric material. Moreover, the planar heater structure includes one or more blanket films (such as the blanket films 150, 250, and the like) disposed over the resistor film. As various embodiment of the planar heater structure of the present disclosure are disclosed above in conjunction with FIGS. 1-32 in the form of the planar heater structures 100, 200, 300, 400, 500, 600, 700 and 800, a description thereof is herein avoided for the sake of brevity.

Figure 33:
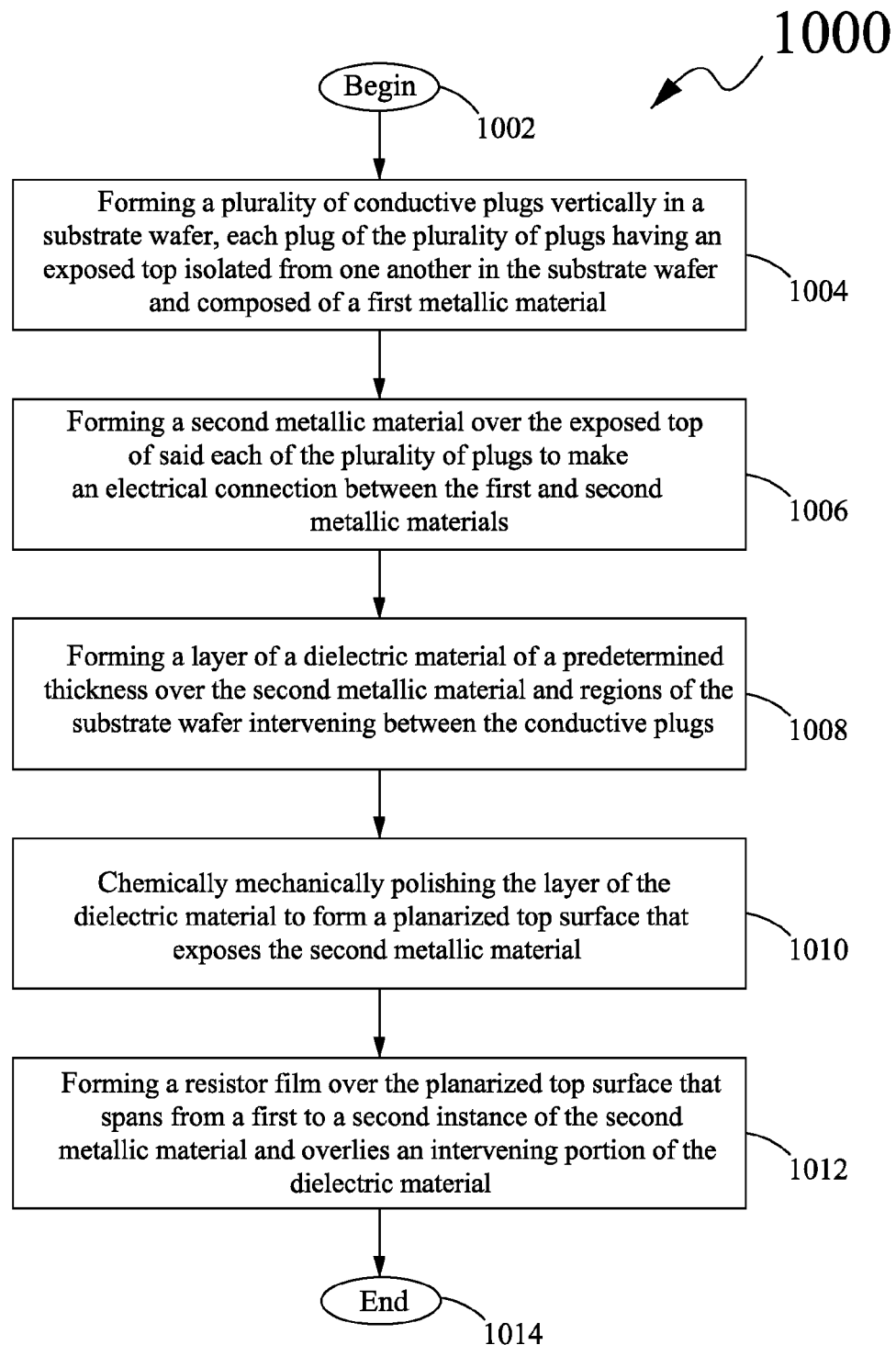
FIG. 33 depicts a method for fabricating a planar heater structure on a substrate wafer for an ejection device, in accordance with still another embodiment of the present disclosure.

According to an alternate embodiment, the present disclosure provides a method 1000 similar to the method 10 for fabricating a planar heater structure, such as the planar heater structure 100, on a substrate wafer, such as the substrate wafer 110. The method 1000 is explained in conjunction with FIG. 33. Further, reference will be made to FIGS. 2-6 for describing the method 1000 of FIG. 33.

The method 1000 begins at 1002. At 1004, a plurality of conductive plugs, such as the plugs 112, is formed vertically in the substrate wafer 110 (as depicted in FIG. 2). The each plug of the plugs 112 includes an exposed top isolated from one another in the substrate wafer 110 and composed of the first metallic material. At 1006, the second metallic material (as part of the layer 120 of the second metallic layer) is formed over the exposed top of said each plug of the plugs 112 to make an electrical connection between the first and second metallic materials (as depicted in FIG. 3). At 1008, the layer 130 of the dielectric material of the predetermined thickness is formed over the second metallic material and regions of the substrate wafer 110 intervening between the plugs 112 (as depicted in FIG. 4). At 1010, the layer 130 of the dielectric material is chemically mechanically polished to form the planarized top surface 132 that exposes the second metallic material (as depicted in FIG. 5). At 1012, the resistor film 140 is formed over the planarized top surface 132 that spans from a first to a second instance of the second metallic material and overlies an intervening portion of the dielectric material (as depicted in FIG. 6). The method 1000 ends at 1014.

Based on the aforementioned, the present disclosure provides methods (such as the methods 10, 40, 70, and 1000) of fabricating planar heater structures (such as the planar heater structures 100, 200, 300, 400, 500, 600, 700 and 800) having a flat topography (heater chip surface topology) in order to improve photo-imageable nozzle plate and glass nozzle plate process margin. The methods of the present disclosure employ fewer masks to reduce cost of fabrication. Further, the use of the methods of the present disclosure streamline frontend and backend fabrication processes. In addition, configuring through-silicon vias using one or more methods of the present disclosure assists in eliminating wire-bond and encapsulation requirements, thereby improving ejection device (printhead) reliability and performance.

Moreover, one or more methods of the present disclosure employ CMP of a dielectric material that may be coplanar with an aluminum surface, for overcoming problems encountered by conducting CMP of aluminum directly. Specifically, the dielectric layer as provided over a substrate wafer typically leaves a certain amount of topography over the aluminum leads, and such topography is planarized by the methods of the present disclosure that employ planarization of the dielectric layer and the aluminum (to some extent) in order to provide a planarized heater surface. In other words, in the process of planarizing the dielectric layer, certain amounts of aluminum are removed to make the entire heater surface to be planar. Further, use of a harder surface, such as the resistor/heater film, TaAlN, as disclosed in the present disclosure, assists in the CMP process for covering the surface of the aluminum. Also, since the heater film is intended to make contact with the aluminum metal in subsequent steps (as described above) of fabrication, the protective layer need not be removed from the respective substrate wafers of the planar heater structures.

The foregoing description of several embodiments of the present disclosure has been presented for purposes of illustration. It is not intended to be exhaustive or to limit the disclosure to the precise forms disclosed, and obviously many modifications and variations are possible in light of the above teaching. It is intended that the scope of the disclosure be defined by the claims appended hereto.

The invention claimed is:

1. A method for fabricating a planar heater structure for an ejection device, the method comprising:
   providing a substrate wafer, the substrate wafer comprising a plurality of plugs configured therewithin, each plug of the plurality of plugs being formed as an electrical connection and composed of a first metallic material;
   depositing and patterning a layer of a second metallic material over the substrate wafer, the patterning leaving a patterned layer of isolated sections of electrical conductors aligned vertically above said each plug and exposing a surface of the substrate wafer;
   providing a layer of a dielectric material of a predetermined thickness over the surface of the substrate wafer and the patterned layer of the isolated sections of electrical conductors;
   conducting chemical mechanical polishing of the layer of the dielectric material and a topmost portion of the patterned layer to form a planarized top surface exposing the patterned layer of the isolated sections of electrical conductors;
   cleaning the planarized top surface; and thereafter forming a resistive heater element to eject fluid, including
      depositing and patterning a resistor film over the planarized top surface thereby connecting either ends of the resistor film to the isolated sections of electrical conductors and to said each plug;
      depositing one or more blanket films over the patterned resistor film; and
      patterning and etching the one or more blanket films.

2. The method of claim 1, further comprising depositing a protective layer on a top surface of the layer of the second metallic material prior to patterning the layer of the second metallic material.

3. The method of claim 1, further comprising depositing a protective layer on a top surface of the layer of the second metallic material after patterning the layer of the second metallic material.

4. The method of claim 1, wherein the first metallic material is tungsten, and the second metallic material is aluminum.

5. The method of claim 1, wherein the dielectric material is methylsilsesquioxane.

6. The method of claim 1, wherein each blanket film of the one or more blanket films is one of silicon based blanket film and tantalum based blanket film.

* * * * *